(12) United States Patent
Wu et al.

(10) Patent No.: US 10,679,825 B2
(45) Date of Patent: Jun. 9, 2020

(54) SYSTEMS AND METHODS FOR APPLYING FREQUENCY AND MATCH TUNING IN A NON-OVERLAPPING MANNER FOR PROCESSING SUBSTRATE

(71) Applicant: Lam Research Corporation, Fremont, CA (US)

(72) Inventors: Ying Wu, Livermore, CA (US); Alex Paterson, San Jose, CA (US); John Drewery, San Jose, CA (US); Arthur Sato, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 269 days.

(21) Appl. No.: 15/814,325

(22) Filed: Nov. 15, 2017

(65) Prior Publication Data
US 2019/0148114 A1    May 16, 2019

(51) Int. Cl.
*H01J 37/32*   (2006.01)
*H03H 11/28*   (2006.01)
*H01L 21/67*   (2006.01)
*H01L 21/687*  (2006.01)

(52) U.S. Cl.
CPC ...... *H01J 37/32183* (2013.01); *H01J 37/321* (2013.01); *H01J 37/32165* (2013.01); *H01J 37/32963* (2013.01); *H01L 21/67069* (2013.01); *H01L 21/68757* (2013.01); *H03H 11/28* (2013.01); *H01J 2237/334* (2013.01)

(58) Field of Classification Search
CPC .......... H05J 37/32165; H05J 37/32183; H05J 37/32963; H05J 37/3299; H05J 37/321; H05J 2237/334; H05J 37/00; H05J 37/32146; H05J 37/3244; H05J 37/3255; H05J 37/32568; H05B 31/26; H01L 21/67069; H01L 21/68757; H01L 21/6833; H03H 11/28
See application file for complete search history.

(56) References Cited

U.S. PATENT DOCUMENTS

| | | |
|---|---|---|
| 8,674,255 B1 | 3/2014 | Lenz et al. |
| 10,395,894 B2 * | 8/2019 | Shoeb ............... H01J 37/32146 |
| 2009/0284156 A1 | 11/2009 | Banna et al. |
| 2017/0125260 A1 | 5/2017 | Tan et al. |
| 2017/0229288 A1 | 8/2017 | Mueller et al. |
| 2017/0345618 A1 | 11/2017 | Schlierf |

OTHER PUBLICATIONS

ISR PCT/US2018/060754, dated Mar. 14, 2019, 3 pages.

* cited by examiner

*Primary Examiner* — Jimmy T Vu
(74) *Attorney, Agent, or Firm* — Penilla IP, APC

(57) ABSTRACT

Systems and methods for applying frequency and match tuning in a non-overlapping manner are described. For example, a radio frequency (RF) generator is tuned for a time interval and an impedance match is not tuned for the time interval. The impedance match is tuned before or after the RF generator is tuned. Such a non-overlap in the tuning of the RF generator and the impedance match facilitates a reduction in reflected power during a pulse without the tuning of the RF generator interfering with the tuning of the impedance match.

15 Claims, 20 Drawing Sheets

SYSTEMS AND METHODS FOR APPLYING FREQUENCY AND MATCH TUNING IN A NON-OVERLAPPING MANNER FOR PROCESSING SUBSTRATE

FIELD

The present embodiments relate to systems and methods for applying frequency and match tuning in a non-overlapping manner for processing a substrate.

BACKGROUND

In some plasma processing systems, a radio frequency (RF) signal is provided to an electrode within a plasma chamber. The RF signal is used to generate plasma within the plasma chamber. The plasma is used for a variety of operations, e.g., clean substrate placed on a lower electrode, etch a substrate, etc. During processing of the substrate using the plasma, the RF signal is pulsed.

It is in this context that embodiments described in the present disclosure arise.

SUMMARY

Embodiments of the disclosure provide systems, apparatus, methods and computer programs for applying frequency and match tuning in a non-overlapping manner for processing a substrate. It should be appreciated that the present embodiments can be implemented in numerous ways, e.g., a process, an apparatus, a system, a device, or a method on a computer readable medium. Several embodiments are described below.

Pulsed plasmas is actively used in plasma etch industry. Improvements in selectivity, profile control, and etch rate have all been shown to improve with pulsed plasmas. A radio frequency (RF) waveform output of an RF generator in a pulse mode is either of a substantially rectangular shape or a rectangular shape with a spike at the beginning of each pulse. An amplitude and time duration of the spike depends on plasma chemistry, condition, and architecture of the RF generator. The RF generator allows a user to set time durations and power levels up to a maximum output of the generator. However, sometimes, the setting of the time durations and power levels leads to ignition issues, such as insufficiency of a power level leading to a lack of plasma ignition, or too much time in a high power state leading to over etching on a wafer. This is because with a vacuum capacitor based impedance match, the impedance match tunes to a fixed plasma impedance. However, in pulsed plasma, the plasma impedance is changing throughout the pulse. Frequency tuning is fast enough to tune the plasma impedance within a pulse, however, frequency tuning is limited in its tuning range and tunes in a limited impedance space. If the impedance match is used at the same time as frequency tuning, an interaction of a frequency tuning algorithm for tuning an RF frequency of the RF generator and a tuning algorithm for tuning the impedance match often leads to oscillations in reflected power due to unnecessary frequency or match tuning.

By using frequency tuning at a beginning of the pulse, a duration of reflected power during each ignition transient is minimized, and the impedance match is tuned during the remainder of the pulse. By actively breaking up the pulse into a frequency tuning period and match tuning period, both methods of plasma impedance tuning are used without interfering with each other. For example, the frequency of the RF generator is tuned during a time interval in which the impedance match is not tuned and the impedance match is tuned during a time interval in which the frequency is not tuned. The separation between the frequency and impedance match tuning facilitates achieving pulse-to-pulse repeatability. The RF waveform having consistency from pulse to pulse is generated by the RF generator by applying the frequency tuning and match tuning separately during each pulse. The RF waveform is repeatable from pulse to pulse with a defined time at the beginning of each pulse and defined high power, which is peak power exceeding a continuous wave maximum power of the RF generator. Thus, a sideways "T" shaped envelope of the RF waveform is generated by the RF generator which not only helps for ignition but also decreases ion angular distribution and increases peak ion energy to allow for high aspect ratio etching.

A defined time of the pulse can also be automatically determined by the RF generator by calculating a reflection coefficient as well as a rate of decrease in power reflected towards the RF generator at the RF generator. By calculating the reflection coefficient and the rate of decrease in the power reflected towards the RF generator, an occurrence of plasma ignition is determined and the spike is automatically controlled. For example, the spike is reduced to be stopped.

In some embodiments, the frequency tuning of the RF generator is performed at the beginning of the pulse and impedance match tuning at the end of the pulse. So even though both the frequency tuning and the impedance match tuning are being used, they remain clear of each other and do not interact with each other at the same time. Typically, as time passes by in the pulse, the plasma impedance becomes more stable. Thus, if the impedance match is blind to the plasma impedance changes in an ignition portion of the pulse where the spike occurs, the impedance match will see a relatively steady plasma impedance and will be able to tune to it without much trouble. However, the beginning of each pulse sees the spike of very large reflected power, which if high enough, leads to the RF generator folding back and not delivering power that is expected. By enabling the frequency tuning at the beginning of pulse and going to fixed frequency just before the match tuning starts, the reflected power spike is minimized.

In various embodiments, a start time and a stop time in terms of pulse percentage for the frequency tuning algorithm is applied. In this manner, the RF generator starts the frequency tuning after a certain duration after the pulse has started and will stop after the stop time. The impedance match has a start time in pulse percentage where the impedance match ignores a percentage of the pulse in which the frequency is tuned. The impedance match is tuned after the stop time of tuning the frequency of the RF generator.

In some embodiments, the frequency tuning is set to automatically stop based on an ignition detection algorithm which would look at the reflection coefficient and a derivative of the reflection coefficient and determine when plasma has been ignited based on a threshold of each. The RF generator communicates with the impedance match so that the impedance match then starts tuning immediately after the frequency tuning ends during the pulse.

In various embodiments, frequency tuning and match tuning are enabled during pulsing at different periods within each pulse.

Some advantages of the herein described systems and methods include an expansion of process space. By tuning the frequency of the RF generator before tuning the impedance match, new processes are created that otherwise would be limited due to high reflected power.

Additional advantages of the herein described systems and methods include an improvement in system power efficiency, which has both environmental and economic impact. The frequency tuning is used to reduce the reflected power during an ignition phase in which the plasma is ignited within the plasma chamber.

Further advantages of the systems and methods include extending lifetime of the RF generator to shorten an average system downtime. The system downtime occurs as a result of a failure of the RF generator. By tuning the frequency before tuning the impedance match, power spikes during the ignition phase are reduced and therefore chances of the failure of the RF generator are reduced.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for applying frequency and match tuning in a non-overlapping manner for processing a substrate. It will be apparent that the present embodiments may be practiced without some or all of these specific details. In other instances, well known process operations have not been described in detail in order not to unnecessarily obscure the present embodiments.

Figure 1A:
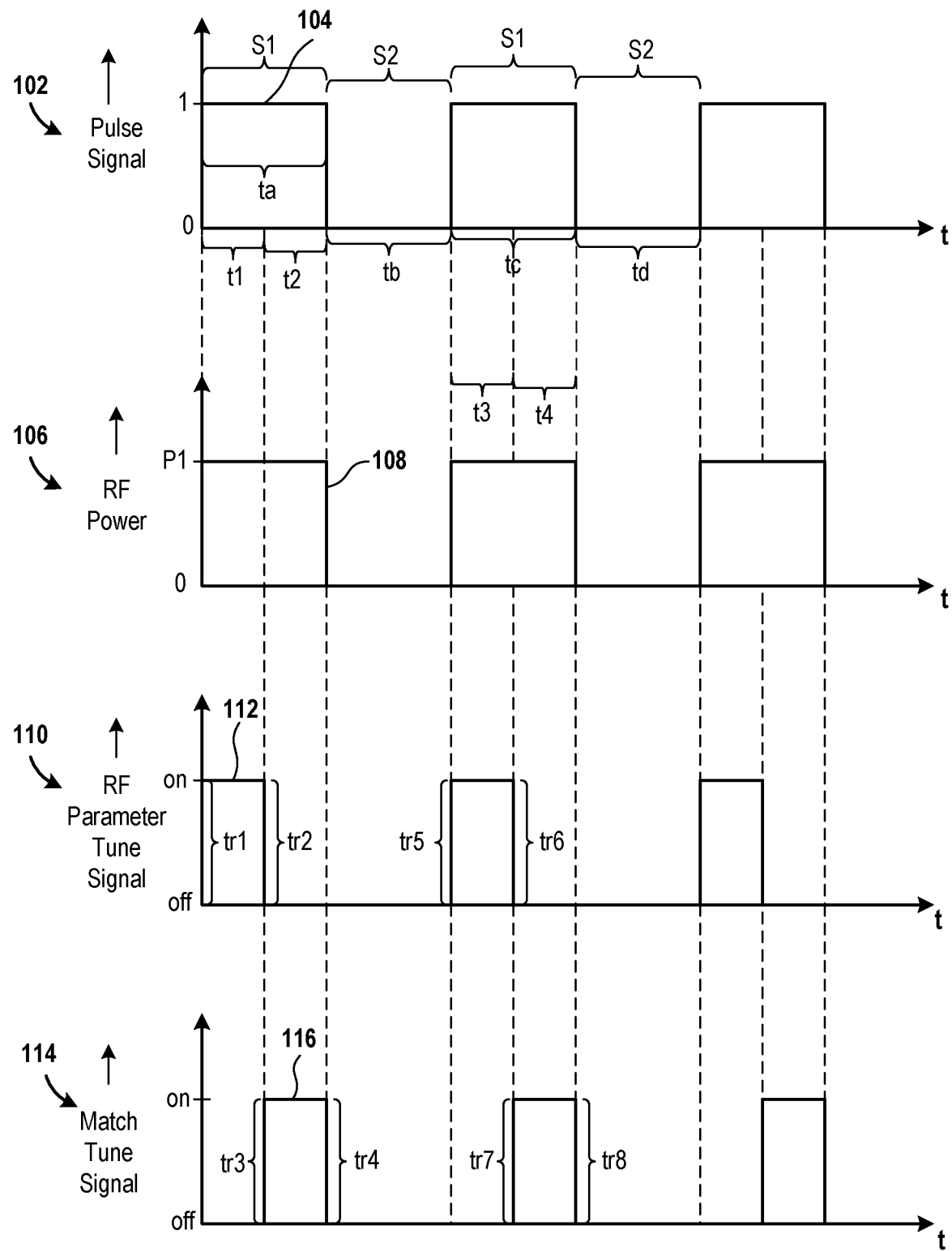
FIG. 1A provides embodiments of graphs to illustrate tuning of a parameter of a radio frequency (RF) generator during a portion of a duty cycle of a pulse signal and tuning of an impedance match during the remaining portion of the duty cycle.

FIG. 1A provides embodiments of graphs 102, 106, 110, and 144 to illustrate tuning of a parameter a radio frequency (RF) generator during a portion of a duty cycle, such as a pulse, of a pulse signal 104 and tuning of an impedance match during the remaining portion of the duty cycle. Examples of the parameter include frequency and power of the RF generator or frequency and power of an RF signal generated by the RF generator. The duty cycle of the pulse signal 104 is approximately 50%, such as ranges between 45% and 55%. The duty cycle of the pulse signal 104 occurs over a time interval, such as a time interval ta or a time interval tc. The graph 102 plots transition between levels of the pulse signal 104 versus time t. For example, the pulse signal 104 transitions from a high level, such as a bit 1, to a low level, such as a bit 0. The pulse signal 104 transitions periodically between the two levels. For example, during each clock cycle, the pulse signal 104 transitions from the high level to the low level. The high level of the pulse signal occurs over the time interval ta and the low level of the pulse signal occurs over a time interval tb. The time interval tb consecutively follows the time interval ta.

Each different level of the pulse signal 104 has a different state. For example, the high level of the pulse signal 104 has a state S1 for the time interval ta and the low level of the pulse signal 104 has a state S2 for the time interval tb. The states S1 and S2 periodically repeat such that S2 occurs a pre-set time period after the state S1 and the state S2 occurs a pre-set time period after the state S1. For example, the state S1 repeats again after the time interval tb. The state S1 repeats during the time interval tc, which consecutively follows the time interval tb. Moreover, the state S2 repeats again after the time interval tc. The state S2 repeats during a time interval td, which consecutively follows the time interval tc.

The pulse signal 104 has the high level during the time interval ta and has the low level during the time interval tb. Moreover, the pulse signal 104 has the high level during the time interval tc and has the low level during the time interval td. It should be noted each of the time intervals ta, tb, tc, and td have approximately the same length of time. For example, each time interval ta, tb, tc, and td has the same number of units, such as microseconds or milliseconds, of time. The time intervals ta and tb form a clock cycle and the time intervals tc and td form another clock cycle.

The time interval ta is divided into substantially equal time intervals t1 and t2. For example, the time interval ta is divided into equal time intervals t1 and t2. As another example, the time interval t1 ranges between 45% and 55% of the time interval ta and the time interval t2 ranges between 45% and 55% of the time interval ta. Similarly, the time interval tc is divided into substantially equal time intervals t3 and t4. It should be noted that each of the time intervals t1, t2, t3, and t4 are substantially the same. For example, each time interval t1, t2, t3, and t4 has the same number of units, such as microseconds or milliseconds, of time.

In some embodiments, the pulse signal 104 is a digital clock signal that is generated by a clock source, such as a digital clock oscillator made from multiple logic gates. The digital clock signal has multiple clock cycles and each clock cycle has a duty cycle for which the digital clock signal has the high level. In various embodiments, the digital clock oscillator is integrated within a processor, such as a central processing unit (CPU), a microprocessor, and application specific integrated circuit (ASIC), or a programmable logic device (PLD).

The graph 106 plots RF power that is generated by the RF generator versus the time t. The RF generator generates an RF signal 108. The RF signal 108 has RF power having a power level P1 for the time interval ta and has a power level of approximately zero for the time interval tb. For example, the RF signal 108 has a power level of zero or a power level that ranges between 0% to 10% of P1 during the time interval tb. The power level P1 during the state S1 is greater than the power level of the RF signal 108 during the state S2. Similarly, the RF signal 108 the power level P1 during the time interval tc and has the power level of approximately zero during the time interval td.

The graph 110 plots an RF parameter tune signal 112 versus the time t. The RF parameter tune signal 112 is a digital pulse signal indicating a time interval during which the parameter of the RF generator is tuned and a time interval during which the parameter is not tuned. The RF parameter tune signal 112 is generated by the same digital clock oscillator that generates the pulse signal 102 or another digital clock oscillator, examples of which are provided above.

The RF parameter tune signal 112 periodically transitions between an on level, such as the bit 1, and an off level, such as the bit 0. For example, during a transition time tr1, the RF parameter tune signal 112 transitions from the off level to the on level. The RF parameter tune signal 112 is at the on level during the time interval t1. Moreover, during a transition time tr2, the RF parameter tune signal 112 transitions from the on level to the off level. The transition time tr2 occurs between the time interval t1 and the time interval t2. Similarly, the transition time tr1 occurs between the time interval t1 and a time interval of the pulse signal 102 that precedes the time interval t1. As such, the parameter is tuned during the time interval t1.

During the time interval t2, the parameter is not tuned. Moreover, during the time interval tb, the parameter is not tuned. For example, during the time intervals t2 and tb, the RF parameter tune signal 112 is at the off level.

During the time interval t3, the parameter is tuned. For example, during a transition time tr5, the RF parameter tune signal 112 transitions from the off level to the on level. The RF parameter tune signal 112 is at the on level during the time interval t3. Moreover, during a transition time tr6, the RF parameter tune signal 112 transitions from the on level to the off level. The transition time tr6 occurs between the time interval t3 and the time interval t4. Similarly, the transition time tr5 occurs between the time interval tb and the time interval t3. As such, the parameter is tuned during the time interval t3.

During the time interval t4, the parameter is not tuned. Moreover, during the time interval td, the parameter is not tuned. For example, during the time intervals t4 and td, the RF parameter tune signal 112 is at the off level.

The RF parameter tune signal 112 periodically repeats during the time intervals ta, tb, tc, and td. For example, the RF parameter tune signal 112 has the on level during the time interval t1, consecutively followed by the off level during the time intervals t2 and tb, further consecutively followed by the on level during the time interval t3, and consecutively followed by the off level during the time intervals t4 and td.

The graph 114 plots a match tune signal 116 versus the time t. The match tune signal 116 is a digital pulse signal indicating a time interval during which a variable, such as a capacitance or an inductance, of the impedance match is tuned and a time interval during which the variable of the impedance match is not tuned. The match tune signal 116 is generated by the digital clock oscillator that generates the pulse signal 102 or the digital clock oscillator that generates the RF parameter tune signal 112 or another digital clock oscillator, examples of which are provided above.

The match tune signal 116 periodically transitions between the on level, and the off level. For example, the match tune signal 116 is at the off level during the time interval t1 and during a transition time tr3, the match tune signal 116 transitions from the off level to the on level. The match tune signal 116 is at the on level during the time interval t2. Moreover, during a transition time tr4, the match tune signal 116 transitions from the on level to the off level. The transition time tr4 occurs between the time interval t2 and the time interval tb. Similarly, the transition time tr3 occurs between the time interval t1 and the time interval t2. As such, the variable of the impedance match is tuned during the time interval t2 and not tuned during the time interval t1.

During the time interval tb, the variable of the impedance match is not tuned. Moreover, during the time interval t3, the variable is not tuned. For example, during the time intervals tb and t3, the match tune signal 116 is at the off level.

During the time interval t4, the variable of impedance match is tuned. For example, during a transition time tr7, the match tune signal 116 transitions from the off level to the on level. The match tune signal 116 is at the on level during the time interval t4. Moreover, during a transition time tr8, the match tune signal 116 transitions from the on level to the off level. The transition time tr8 occurs between the time interval t4 and the time interval td. Similarly, the transition time tr7 occurs between the time interval t3 and the time interval t4. As such, the variable is tuned during the time interval t4.

During the time interval td, the variable of the impedance match is not tuned. For example, during the time interval td, the match tune signal 114 is at the off level.

When the parameter of the RF generator is tuned, the variable of the impedance match is not tuned and when the variable is tuned, the parameter is not tuned. For example, the RF parameter tune signal 112 is on, such as at the on level, during the time intervals t1 and t3. During each of the time intervals t1 and t3, the match tune signal 116 is off, such as at the off level. Moreover, the RF parameter tune signal 112 is off during the time intervals t2 and t4. During each of the time intervals t2 and t4, the match tune signal 116 is on.

The match tune signal 116 periodically repeats during the time intervals ta, tb, tc, and td. For example, the match tune signal 116 has the off level during the time interval t1, consecutively followed by the on level during the time interval t2, further consecutively followed by the off level during the time intervals tb and tc, consecutively followed by the on level during the time interval t4, and consecutively followed by the off level during the time interval td.

In some embodiments, a transition from an off level to an on level of a tune signal, such as an RF parameter tune signal or a match tune signal, described herein, occurs during a time period in which the tune signal is at the on level. To illustrate, the transitions tr1 and tr2 occur during the time interval t1 and the transitions tr3 and tr4 occur during the time interval t2.

Figure 1B:
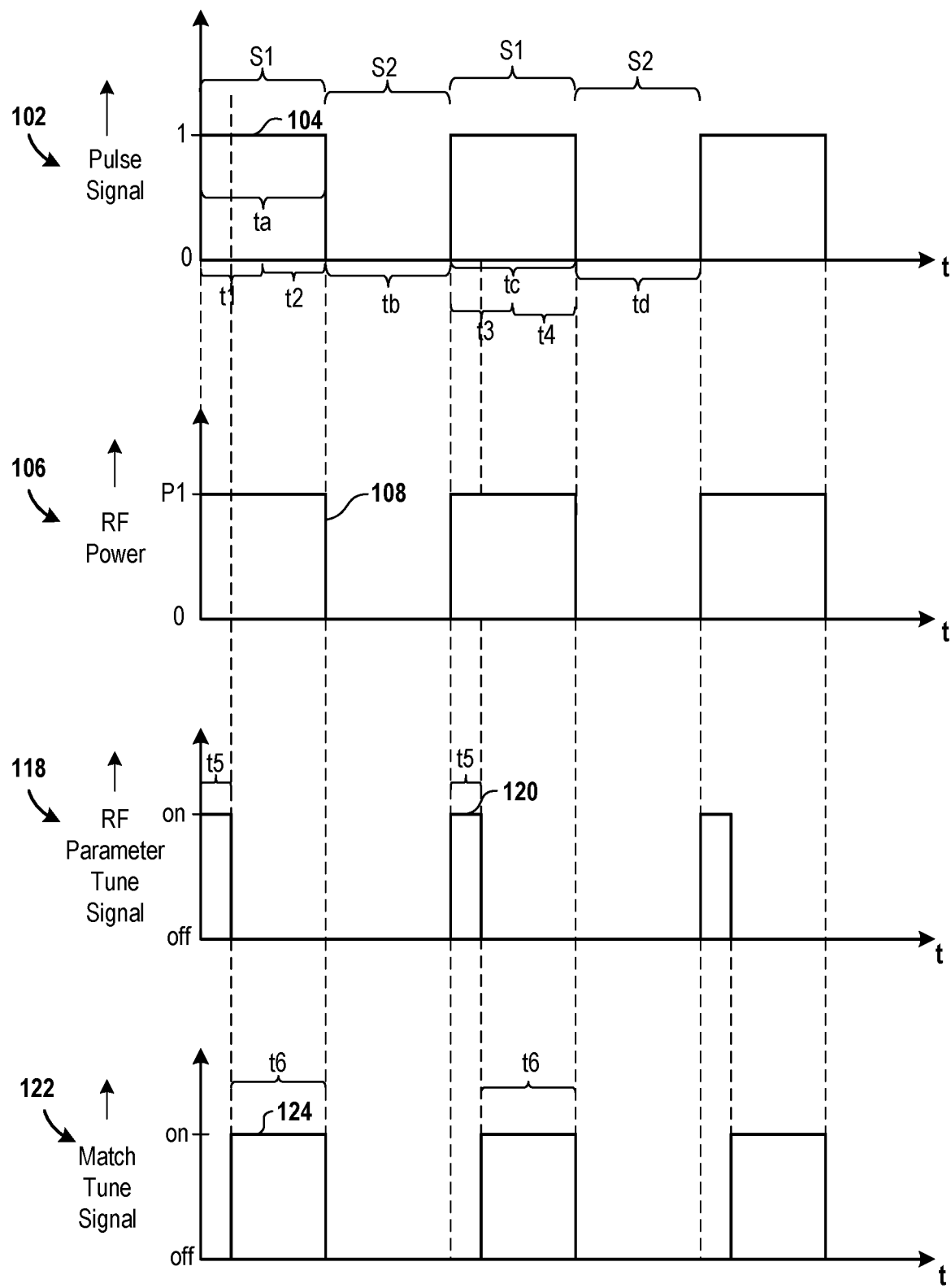
FIG. 1B illustrates embodiments of graphs to illustrate that the RF generator is tuned for less than half of the duty cycle of the pulse signal and the impedance match is tuned for greater than half of the duty cycle of the pulse signal.

FIG. 1B illustrates embodiments of the graph 102, the graph 106, a graph 118, and a graph 122 to illustrate that the RF generator is tuned for less than half of the duty cycle of the pulse signal 104 and the impedance match is tuned for greater than half of the duty cycle of the pulse signal 104. The graph 118 plots an RF parameter tune signal 120 versus the time t. Moreover, the graph 122 plots a match tune signal 124 versus the time t. The RF parameter tune signal 120 is the same as the RF parameter tune signal 110 of FIG. 1A except that the RF parameter tune signal 120 is at the on level for less than the time interval t1 and has the off level for greater than the time interval t2 during the duty cycle of the pulse signal 104. For example, during the duty cycle of the pulse signal 102 having the time interval ta, the RF parameter tune signal 120 transitions at a transition time from the off level to the on level and stays at the on level for a time interval t5 that is less than the time interval t1. After remaining at the on level, the RF parameter tune signal 120 transitions at a transition time from the on level to the off level before an end of the time interval t1. After transitioning to the off level, the RF parameter tune signal 120 stays at the off level during a portion of the time interval t1, during the time interval t2, and during the time interval tb. The RF parameter tune signal 120 then transitions, at a transition time, to the on level at an end of the time interval tb. The RF parameter tune signal 120 remains at the on level for the time interval t5 that is less than the time interval t3. The RF parameter tune signal 120 then transitions from the on level to the off level at a transition time before an end of the transition interval t3. The RF parameter tune signal 120 stays at the off level for a portion of the time interval t3, the time interval t4, and the time interval td. As such, the RF parameter tune signal 120 periodically repeats between the on level and the off level during the time intervals ta, tb, tc, and td.

Similarly, the match tune signal 124 is the same as the match tune signal 116 of FIG. 1A except that the match tune signal 124 is at the off level for less than the time interval t1 and has the on level for greater than the time interval t2 during each duty cycle of the pulse signal 104. For example, during the duty cycle of the pulse signal 102 having the time interval ta, the match tune signal 124 remains at the off level for a portion of the time interval t1. The match tune signal 124 then transitions at a transition time from the off level to the on level and stays at the on level for a time interval t6 that is greater than the time interval t2. After remaining at the on level, the match tune signal 124 transitions at a transition time from the on level to the off level at an end of the time interval t2. After transitioning to the off level, the match tune signal 124 stays at the off level during the time interval tb, and during a portion of time interval t3. The match tune signal 124 then transitions, at a transition time, to the on level before an end of the time interval t3 and remains at the on level for the time interval t4. As such, the match tune signal 124 remains at the on level for the time interval t6 that is greater than the time interval t4. The match tune signal 124 then transitions from the on level to the off level at a transition time at an end of the time interval t4. The match tune signal 124 stays at the off level for the time interval td. As such, the match tune signal 124 periodically repeats between the on level and the off level during the time intervals ta, tb, tc, and td.

It should be noted that during each of the time intervals ta, tb, and tc, the RF parameter tune signal 120 is at the on level for the time interval t5 for which the match in signal 124 is at the off level. Similarly, during each of the time intervals ta, tb, and tc, the RF parameter tune signal 120 is at the off level for the time interval t6 for which the match in signal 124 is at the on level.

In some embodiments, it should be noted that a transition time, as described herein, is a transition time interval or a transition time period.

Figure 1C:
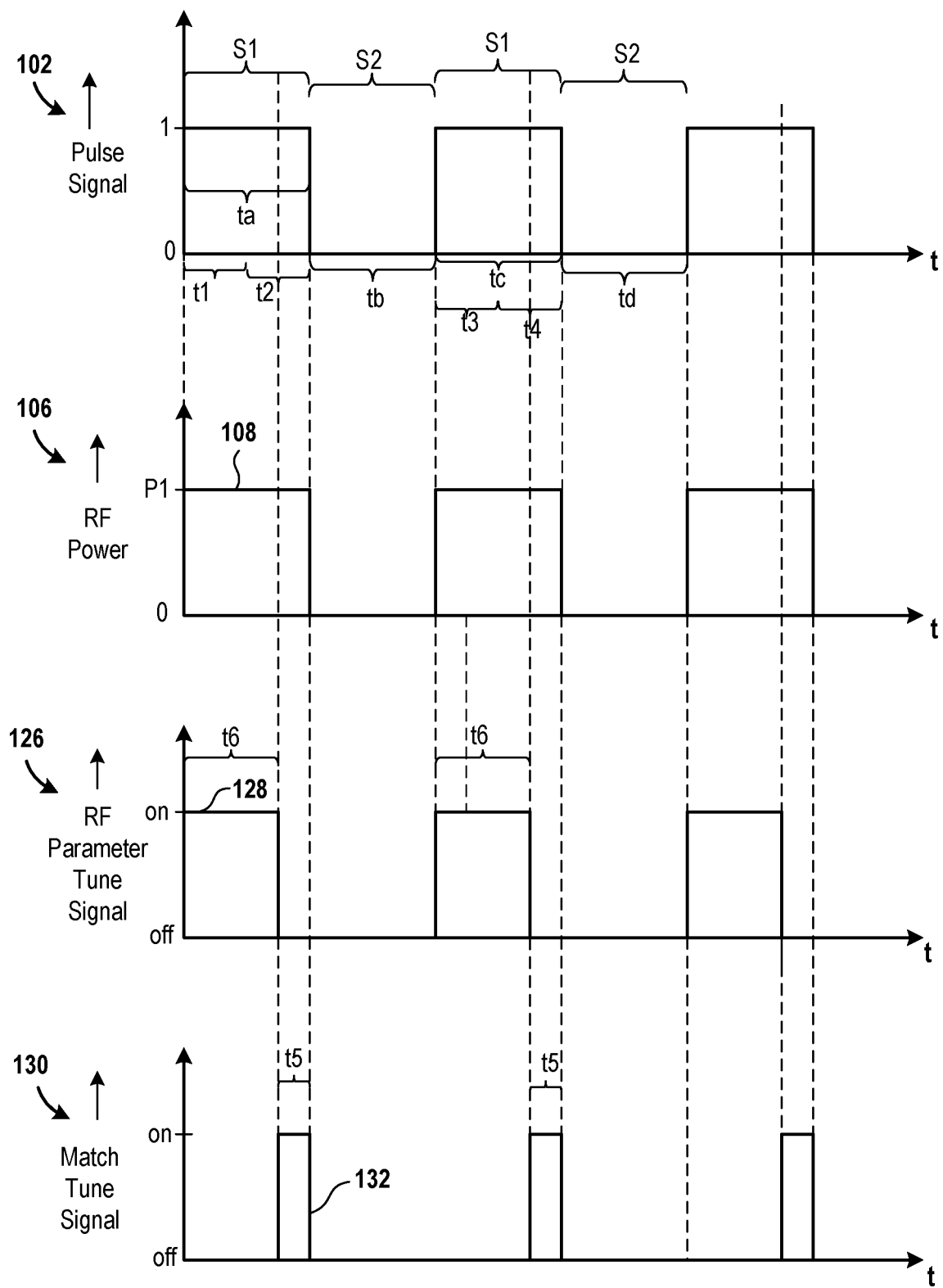
FIG. 1C illustrates embodiments of graphs to illustrate that the RF generator is tuned for greater than half of the duty cycle of the pulse signal and the impedance match is tuned for less than half of the duty cycle of the pulse signal.

FIG. 1C illustrates embodiments of the graph 102, the graph 106, a graph 126, and a graph 130 to illustrate that the RF generator is tuned for greater than half of the duty cycle of the pulse signal and the impedance match is tuned for less than half of the duty cycle of the pulse signal. The graph 126 plots an RF parameter tune signal 128 versus the time t. Moreover, the graph 130 plots a match tune signal 132 versus the time t. The RF parameter tune signal 128 is the same as the RF parameter tune signal 110 of FIG. 1A except that the RF parameter tune signal 128 as the on level for greater than the time interval t1 and has the off level for less than the time interval t2 during each duty cycle of the pulse signal 104. For example, at a beginning of the duty cycle of the pulse signal 102 having the time interval ta, the RF parameter tune signal 128 transitions at a transition time from the off level to the on level and stays at the on level for the time interval t6 that is greater than the time interval t1. After remaining at the on level, the RF parameter tune signal 128 transitions at a transition time from the on level to the off level after the time interval t1 and before an end of the time interval t2. After transitioning to the off level, the RF parameter tune signal 128 stays at the off level during a portion of the time interval t2 and during the time interval tb. The RF parameter tune signal 128 then transitions, at a transition time, at a beginning of the time interval tc to the on level. The RF parameter tune signal 128 remains at the on level for the time interval t6 that is greater than the time interval t3. The RF parameter tune signal 128 then transitions from the on level to the off level at a transition time after the time interval t3. The RF parameter tune signal 120 stays at the off level for a portion of the time interval t4 and the time interval td. As such, the RF parameter tune signal 128 periodically repeats between the on level and the off level during the time intervals ta, tb, tc, and td.

Similarly, the match tune signal 132 is the same as the match tune signal 116 of FIG. 1A except that the match tune signal 132 is at the off level for greater than the time interval t1 and has the on level for less than the time interval t2. For example, during the duty cycle of the pulse signal 102 having the time interval ta, the match tune signal 132 remains at the off level for greater than the time interval t1. Then during the time interval t2, the match tune signal 124 transitions at a transition time from the off level to the on level and stays at the on level for the time interval t5 that is less than the time interval t2. After remaining at the on level, the match tune signal 132 transitions at a transition time from the on level to the off level at an end of the time interval t2. After transitioning to the off level, the match tune signal 132 stays at the off level during the time interval tb, the time interval t3, and during a portion of time interval t4. The match tune signal 132 then transitions, at a transition time, from the off level to the on level during the time interval t4 before an end of the time interval t4. The match tune signal 132 remains at the on level for the time interval t5. The match tune signal 132 then transitions from the on level to the off level at a transition time at an end of the time interval t4. The match tune signal 132 stays at the off level for the time interval td. As such, the match tune signal 132 periodically repeats between the on level and the off level during the time intervals ta, tb, tc, and td.

It should be noted that during each of the time intervals ta, tb, and tc, the RF parameter tune signal 128 is at the on level for the time interval t6 for which the match in signal 132 is at the off level. Similarly, during each of the time intervals ta, tb, and tc, the RF parameter tune signal 128 is at the off level for the time interval t5 for which the match tune signal 132 is at the on level.

Figure 2A:
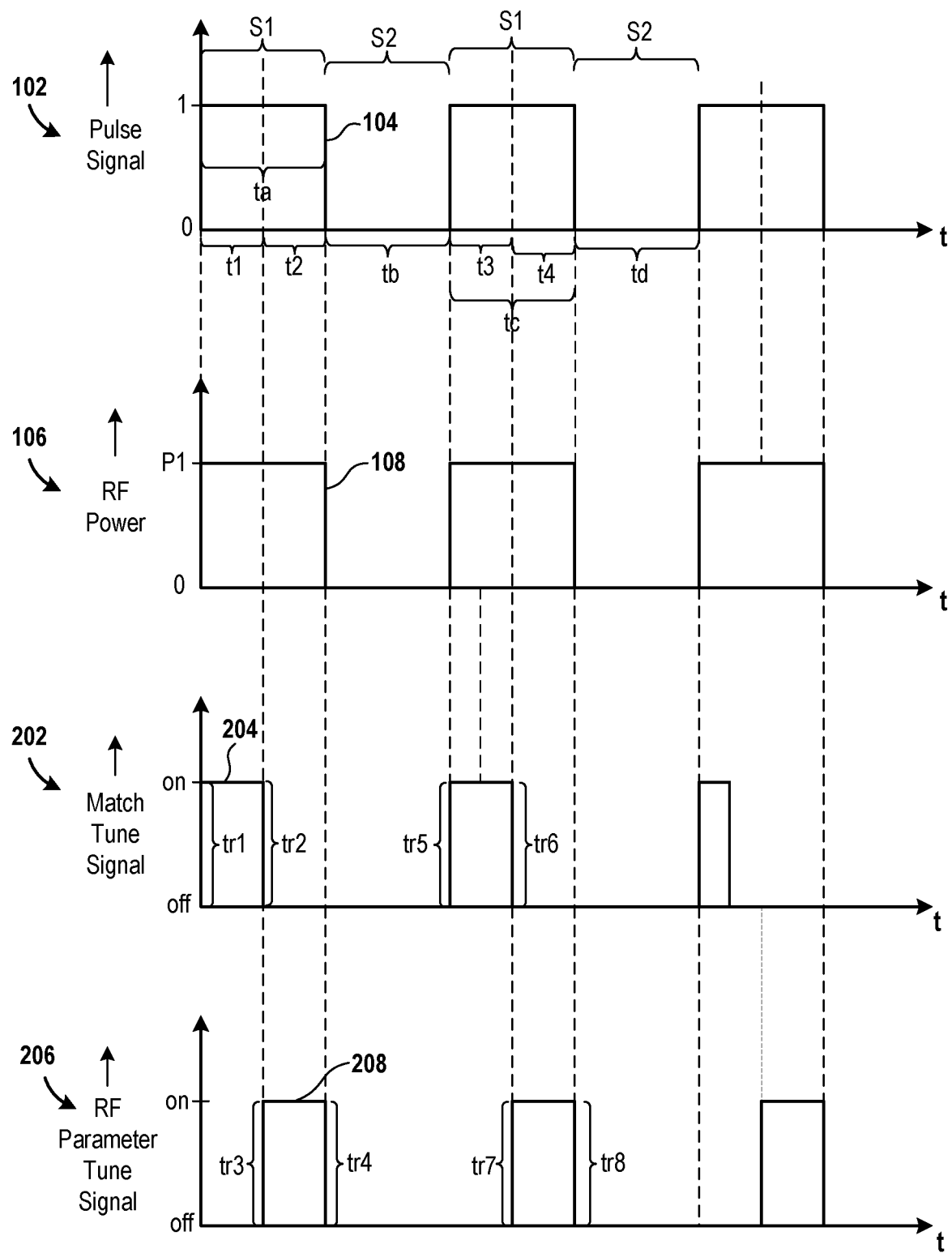
FIG. 2A illustrates embodiments of graphs to illustrate that the impedance match is tuned for half of the duty cycle of the pulse signal before tuning the RF generator during each pulse of the pulse signal.

FIG. 2A illustrates embodiments of the graph 102, the graph 106, a graph 202, and a graph 206 to illustrate that the impedance match is tuned for half of the duty cycle of the pulse signal 104 before tuning the RF generator during each pulse of the pulse signal 104. The graph 202 plots an RF parameter tune signal 204 versus the time t. Moreover, the graph 206 plots a match tune signal 208 versus the time t. The RF parameter tune signal 204 is the same as the RF parameter tune signal 112 of FIG. 1A except that the RF parameter tune signal 208 is at the off level during the time interval t1, at the on level during the time interval t2, at the off level during the time interval t3, and at the on level during the time interval t4. For example, the RF parameter tune signal 208 transitions from the off level to the on level at the transition time tr3, stays at the on level for the time interval t2, and transitions at the transition time tr4 from the on level to the off level. The RF parameter tune signal 208 remains at the off level during the time interval tb and the time interval t3, and then transitions from the off level to the on level at the transition time tr7. The RF parameter tune signal 208 remains at the on level during the time interval t4, transitions from the on level to the off level at the transition time tr8, and remains at the off level during the time interval td.

Similarly, the match tune signal 204 is the same as the match tune signal 116 of FIG. 1A except that the match tune signal 204 is at the on level during the time interval t1, at the off level during the time interval t2, at the on level during the time interval t3, and at the off level during the time interval t4. For example, the match tune signal 204 transitions from the off level to the on level at the transition time tr1, stays at the on level for the time interval t1, and transitions at the transition time tr2 from the on level to the off level. The match tune signal 204 remains of the off level during the time interval t3 and the time interval tb, and then transitions from the off level to the on level at the transition time tr5. The match tune signal 204 remains at the on level during the time interval t3, transitions from the on level to the off level at the transition time tr6, and remains at the off level during the time intervals t4 and td.

It should be noted that during the time interval ta, the RF parameter tune signal 208 is at the off level for the time interval t1 for which the match in signal 204 is at the on level. Similarly, during the time interval ta, the RF parameter tune signal 208 is at the on level for the time interval t2 for which the match tune signal 132 is at the off level. Moreover, it should be noted that during the time interval tc, the RF parameter tune signal 208 is at the off level for the time interval t3 for which the match in signal 204 is at the on level. Similarly, during the time interval tc, the RF parameter tune signal 208 is at the on level for the time interval t4 for which the match tune signal 132 is at the off level.

Figure 2B:
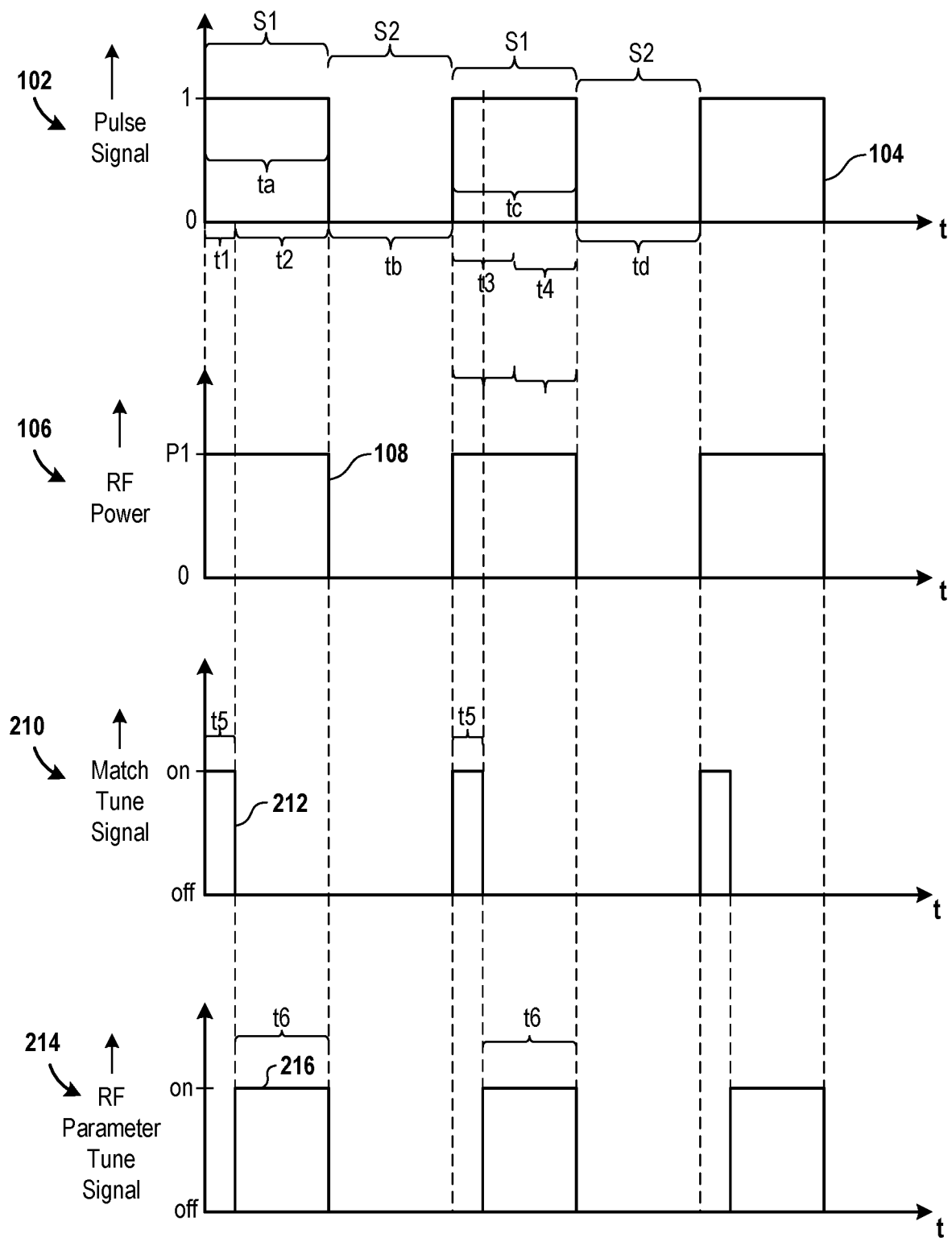
FIG. 2B illustrates embodiments of graphs to illustrate that the impedance match is tuned for less than half of the duty cycle of the pulse signal before tuning the RF generator during each pulse of the pulse signal.

FIG. 2B illustrates embodiments of the graph 102, the graph 106, a graph 210, and a graph 214 to illustrate that the impedance match is tuned for less than half of the duty cycle of the pulse signal 104 before tuning the RF generator during each pulse of the pulse signal 104. The graph 210 plots a match tune signal 212 versus the time t. Moreover, the graph 214 plots an RF parameter tune signal 214 versus the time t. The match tune signal 212 is the same as the match tune signal 124 of FIG. 1B except that during the time interval t5, the match tune signal 212 is at the on level and during the time interval t6, the match tune signal 212 is at the off level. For example, at a beginning of the duty cycle of the pulse signal 102 having the time interval ta, the match tune signal 212 transitions at a transition time from the off level to the on level and stays at the on level for the time interval t5 that is less than the time interval t1. After remaining at the on level, the match tune signal 212 transitions at a transition time from the on level to the off level before an end of the time interval t1. After transitioning to the off level, the match tune signal 212 stays at the off level during a portion of the time interval t1, during the time interval t2, and during the time interval tb. The match tune signal 212 then transitions, at a transition time, to the on level at an end of the time interval tb. The match tune signal 212 remains at the on level for the time interval t5 that is less than the time interval t3. The match tune signal 212 then transitions from the on level to the off level at a transition time before beginning of the time interval t4. The match tune signal 212 transitions from the on level to the off level at the transition time before an end of the transition interval t3. The match tune signal 212 stays at the off level for a portion of the time interval t3, the time interval t4, and the time interval td. As such, the match tune signal 212 periodically repeats between the on level and the off level during the time intervals ta, tb, tc, and td.

Similarly, the RF parameter tune signal 216 is the same as the RF parameter tune signal 120 of FIG. 1B except that the RF parameter tune signal 216 is at the off level for less than the time interval t1 and has the on level for greater than the time interval t2 during each duty cycle of the pulse signal 104. For example, during the duty cycle of the pulse signal 104 having the time interval ta, the RF parameter tune signal 216 remains at the off level for a portion of the time interval t1, such as for the time interval t5. The RF parameter tune signal 216 then transitions at a transition time from the off level to the on level and stays at the on level for the time interval t6 that is greater than the time interval t2. After remaining at the on level, the RF parameter tune signal 216 transitions at a transition time from the on level to the off level at an end of the time interval t2. After transitioning to the off level, the RF parameter tune signal 216 stays at the off level during the time interval t2, and during a portion of time interval t3. The portion of the time interval t3 for which the RF parameter tune signal 216 is at the off level is t5. The RF parameter tune signal 216 then transitions, at a transition time, to the on level during the time interval t3 before an end of the time interval t3. The RF parameter tune signal 216 remains at the on level for the time interval t6 that is greater than the time interval t4. The RF parameter tune signal 216 then transitions from the on level to the off level at a transition time at an end of the time interval t4. The RF parameter tune signal 216 stays at the off level for the time interval td. As such, the RF parameter tune signal 216 periodically repeats between the on level and the off level during the time intervals ta, tb, tc, and td.

It should be noted that during each of the time intervals ta, tb, and tc, the RF parameter tune signal 216 is at the on level for the time interval t6 for which the match tune signal 212 is at the off level. Similarly, during each of the time intervals ta, tb, and tc, the RF parameter tune signal 216 is at the off level for the time interval t5 for which the match tune signal 212 is at the on level.

Figure 2C:
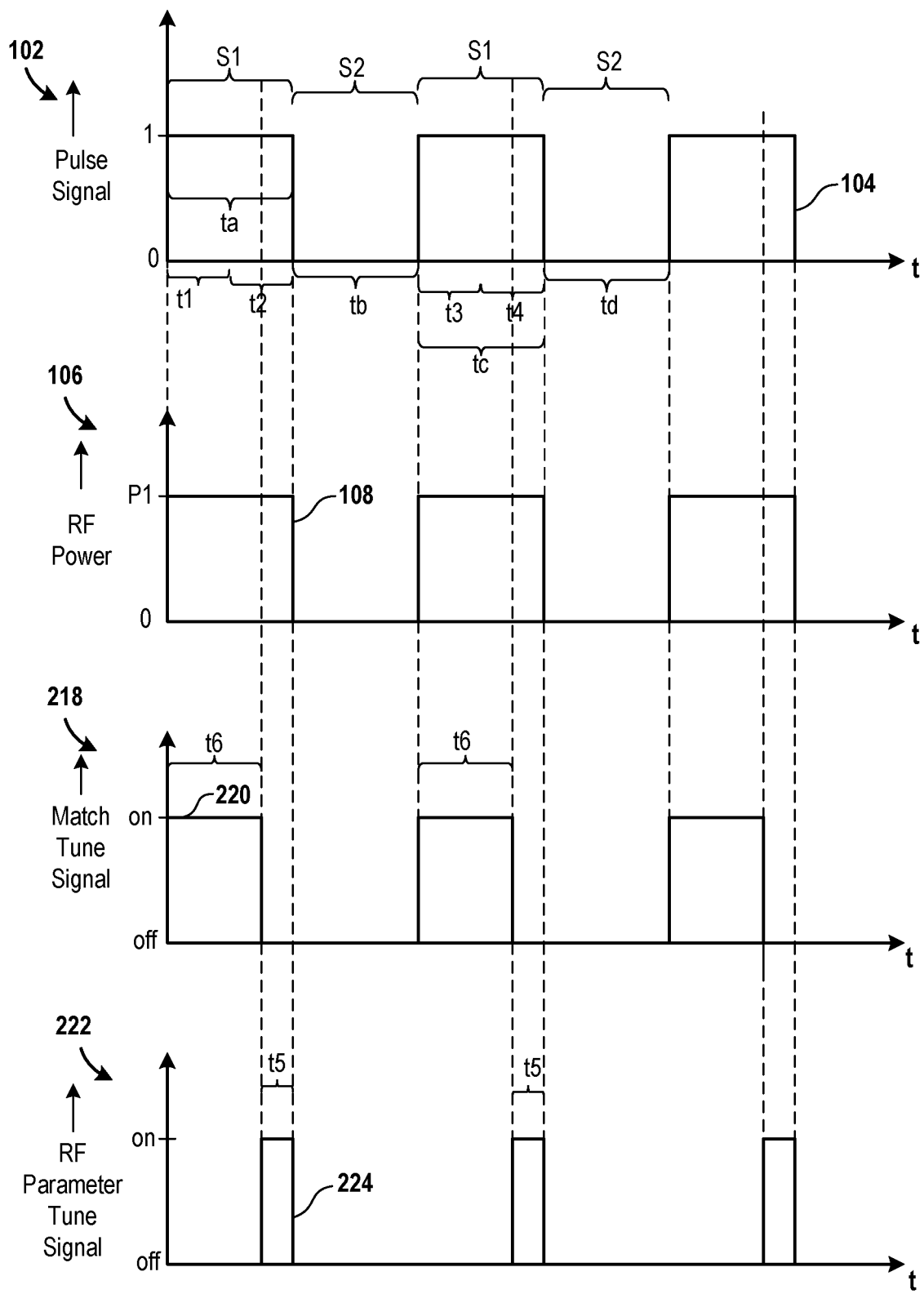
FIG. 2C illustrates embodiments of graphs to illustrate that the impedance match is tuned for greater than half of the duty cycle of the pulse signal before tuning the RF generator during each pulse of the pulse signal.

FIG. 2C illustrates embodiments of the graph 102, the graph 106, a graph 218, and a graph 222 to illustrate that the impedance match is tuned for greater than half of the duty cycle of the pulse signal 104 before tuning the RF generator during each pulse of the pulse signal 104. The graph 218 plots a match tune signal 220 versus the time t. Moreover, the graph 222 plots an RF parameter tune signal 224 versus the time t. The match tune signal 220 is the same as the match tune signal 132 of FIG. 1C except that during the time interval t6, the match tune signal 220 is at the on level and during the time interval t5, the match tune signal 220 is at the off level. For example, at a beginning of the duty cycle of the pulse signal 102 having the time interval ta, the match tune signal 220 transitions at a transition time from the off level to the on level and stays at the on level for the time interval t6 that is greater than the time interval t1. After remaining at the on level, the match tune signal 220 transitions at a transition time from the on level to the off level after the time interval t1. After transitioning to the off level, the match tune signal 220 stays at the off level during a portion of the time interval t2 and during the time interval tb. The match tune signal 220 then transitions, at a transition time, at a beginning of the time interval tc to the on level. The match tune signal 220 remains at the on level for the time interval t6 that is greater than the time interval t3. The match tune signal 220 then transitions from the on level to the off level at a transition time after the time interval t3. The match tune signal 220 stays at the off level for a portion of the time interval t4 and the time interval td. As such, the match tune signal 220 periodically repeats between the on level and the off level during the time intervals ta, tb, tc, and td.

Similarly, the RF parameter tune signal 224 is the same as the RF parameter tune signal 128 of FIG. 1C except that during the time interval t6, RF parameter tune signal 224 is at the off level and during the time interval t5, the RF parameter tune signal 224 is at the on level. For example, during the duty cycle of the pulse signal 102 having the time interval ta, the RF parameter tune signal 224 remains at the off level for greater than the time interval t1 and for a portion of the time interval t2. Then during the time interval t2 and before an end of the time interval t2, the RF parameter tune signal 224 transitions at a transition time from the off level to the on level and stays at the on level for the time interval t5 that is less than the time interval t2. After remaining at the on level, the RF parameter tune signal 224 transitions at a transition time from the on level to the off level at an end of the time interval t2. After transitioning to the off level, the RF parameter tune signal 224 stays at the off level during the time interval tb, the time interval t3, and during a portion of time interval t4. The RF parameter tune signal 224 then transitions, at a transition time, from the off level to the on level during the time interval t4 before an end of the time interval t4. The RF parameter tune signal 224 remains at the on level for the time interval t5. The RF parameter tune signal 224 then transitions from the on level to the off level at a transition time at an end of the time interval t4. The RF parameter tune signal 224 stays at the off level for the time interval td. As such, the RF parameter tune signal 224 periodically transitions between the on level and the off level during the time intervals ta, tb, tc, and td.

It should be noted that during each of the time intervals ta, tb, and tc, the RF parameter tune signal 224 is at the on level for the time interval t5 for which the match tune signal 220 is at the off level. Similarly, during each of the time intervals ta, tb, and tc, the RF parameter tune signal 224 is at the off level for the time interval t6 for which the match tune signal 220 is at the on level.

Figure 3A:
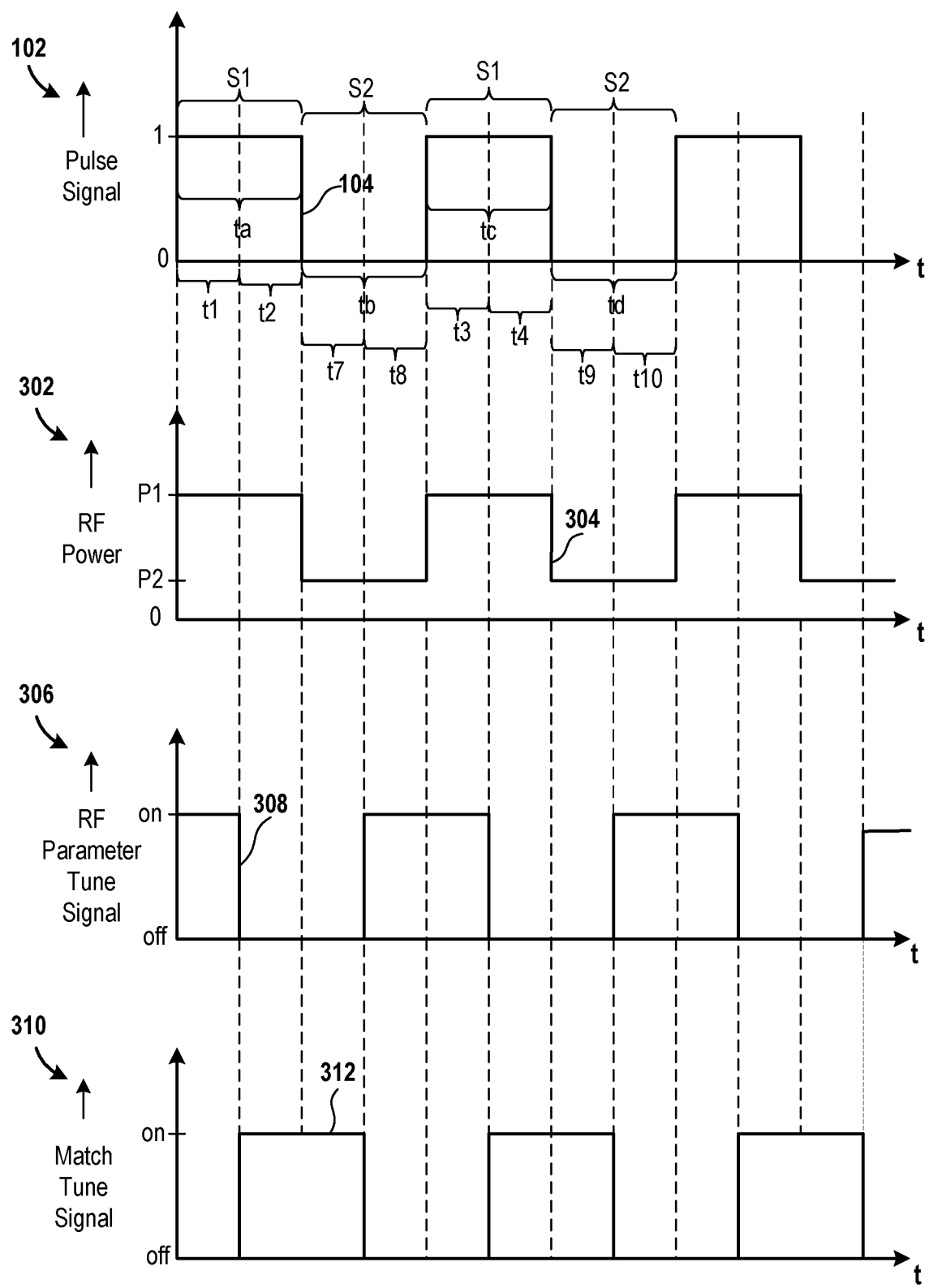
FIG. 3A illustrates embodiments of graphs to illustrate that the impedance match is tuned during half of the duty cycle of the pulse signal and half of a time interval for which the pulse signal is off.

FIG. 3A illustrates embodiments of the graph 102, a graph 302, a graph 306, and a graph 310 to illustrate that the impedance match is tuned during half of the duty cycle of the pulse signal 104 and half of the time interval for which the pulse signal 104 is off. The time interval tb of the pulse signal 102 is split substantially equally into two time intervals t7 and t8. For example, the time interval t7 has approximately the same number of units of time as that of the time interval t8. To illustrate, a length of the time interval t7 is within 90 to 100 percent of a length of the time interval t8. As another example, the time interval t7 has the same number of units of time as that of the time interval t8. Similarly, time interval td of the pulse signal 102 is split substantially equally into two time intervals t9 and t10. For example, the time interval t9 has approximately the same number of units of time as that of the time interval t10. To illustrate, a length of the time interval t9 is within 90 to 100 percent of a length of the time interval t10. As another example, the time interval t9 has the same number of units of time as that of the time interval t10.

The time interval t2 consecutively follows the time interval t1 and the time interval t7 consecutively follows the time interval t2. Moreover, the time interval t8 consecutively follows the time interval t7. Also, the time interval t3 consecutively follows the time interval t8. The time interval t4 consecutively follows the time interval t3. Moreover, the time interval t9 consecutively follows the time interval t4. The time interval t10 consecutively follows the time interval t9.

The graph 302 plots RF power of an RF signal 304 that is generated by the RF generator versus the time t. The RF signal 304 has the power level P1 during the time interval ta and has a power level P2 during the time interval tb. For example, the RF signal 304 has the power level P2 that is greater than zero and less than the power level P1. Similarly, the RF signal 108 has the power level P1 during the time interval tc and has the power level P2 during the time interval td. The RF signal 304 is the same as the RF signal 108 of FIGS. 1A-2C except that the RF signal 304 has the power level P2 instead of the power level of approximately zero during the time intervals tb and td.

The power level P1 is greater than the power level P2. For example, the power level P1 has a value of 2000 watts and the power level of P2 has a value of 400 watts. As another example, the power level of P1 has a value of 1000 watts and the power level of P2 has a value of 300 watts.

Moreover, the graph 306 plots an RF parameter tune signal 308 for tuning the RF signal 304 versus the time t. The RF parameter tune signal 308 is a digital pulse signal indicating a time interval during which the parameter of the RF generator is tuned and a time interval during which the parameter is not tuned. The RF parameter tune signal 308 is generated by the same digital clock oscillator that generates the pulse signal 102 or another digital clock oscillator, examples of which are provided above.

The RF parameter tune signal 308 transitions at a transition time from the off level to the on level at a beginning of the time interval t1 and stays at the on level for the time interval t1. The RF parameter tune signal 308 transitions at a transition time from the on level to the off level at an end of the time interval t1 and stays at the off level during the time interval t2 and during the time interval t7. The RF parameter tune signal 308 transitions at a transition time from the off level to the on level at a beginning of the time interval t8 and stays at the on level for the time intervals t8 and t3. The RF parameter tune signal 308 transitions at a transition time from the on level to the off level at an end of the time interval t3 and stays at the off level for the time intervals t4 and t9. The RF parameter tune signal 308 transitions at an end of the time interval t9 from the off level to the on level and stays at the on level for the time interval t10. As such, the RF parameter tune signal 308 periodically transitions between the on level and the off level during the time intervals ta, tb, tc, and td.

Furthermore, the graph 310 plots a match tune signal 312 versus the time t. The match tune signal 312 is a digital pulse signal indicating a time interval during which the variable of the impedance match is tuned and a time interval during which the variable of the impedance match is not tuned. The match tune signal 312 is generated by the digital clock oscillator that generates the pulse signal 102 or the digital clock oscillator that generates the RF parameter tune signal 308 or another digital clock oscillator, examples of which are provided above.

The match tune signal 312 is at the off level during the time interval t1. The match tune signal 312 transitions at a transition time from the off level to the on level at a beginning of the time interval t2 and stays at the on level for the time intervals t2 and t7. The match tune signal 312 transitions at a transition time from the on level to the off level at an end of the time interval t7 and stays at the off level during the time intervals t8 and t3. The match tune signal 312 transitions at a transition time from the off level to the on level at a beginning of the time interval t4 and stays at the on level for the time intervals t4 and t9. The match tune signal 312 transitions at an end of the time interval t9 from the on level to the off level and stays at the off level for the time interval t10. As such, the match tune signal 312 periodically transitions between the on level and the off level during the time intervals ta, tb, tc, and td.

Accordingly, the match tune signal 312 is at the off level when the RF parameter tune signal 308 is at the on level and the match tune signal 312 is at the on level when the RF parameter tune signal 308 is at the off level. For example, during the time intervals t1, t8, t3, and t10, the RF parameter tune signal 308 is at the on level and the match tune signal 312 is at the off level. Moreover, during the time intervals t2, t7, t4, and t9, the RF parameter tune signal 308 is at the off level and the match tune signal 312 is at the on level.

Figure 3B:
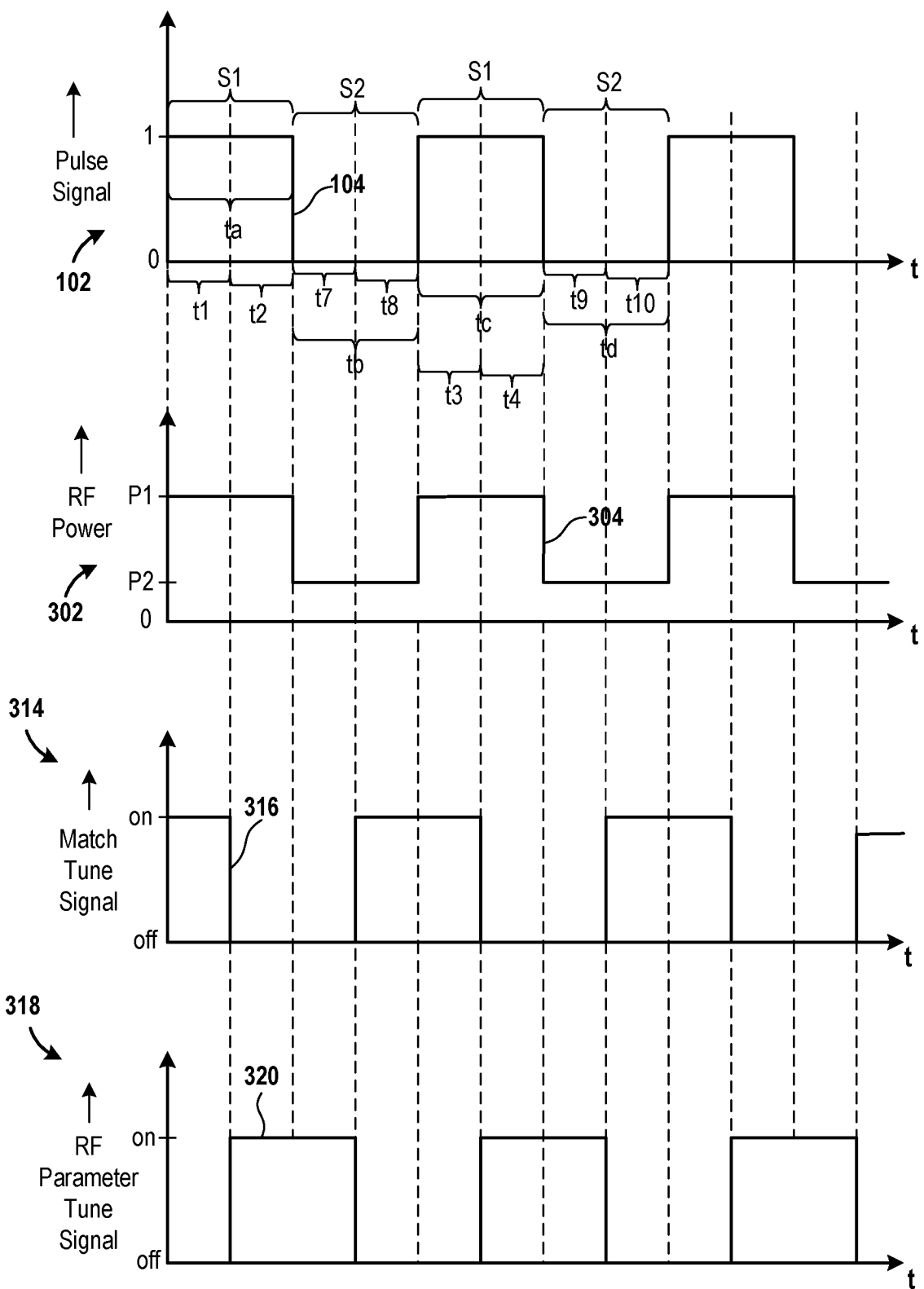
FIG. 3B illustrates embodiments of graphs to illustrate that the RF generator is tuned during half of the duty cycle of the pulse signal and half of the time interval for which the pulse signal is off.

FIG. 3B illustrates embodiments of the graph 102, the graph 302, a graph 314, and a graph 318 to illustrate that the RF generator is tuned during half of the duty cycle of the pulse signal 104 and half of the time interval for which the pulse signal 104 is off. The graph 314 plots a match tune signal 316 versus the time t and the graph 318 plots an RF parameter tune signal 320 versus the time t.

The match tune signal 316 is generated in the same manner as the match tune signal 312 of FIG. 3A except that the match tune signal 316 is at the on level when the match tune signal 312 is at the off level and the match tune signal 316 is at the off level when the match tune signal 312 is at the on level. For example, the match tune signal 316 transitions at a transition time from the off level to the on level at a beginning of the time interval t1 and stays at the on level for the time interval t1. The match tune signal 316 transitions at a transition time from the on level to the off level at an end of the time interval t1 and stays at the off level during the time interval t1 and during the time interval t7. The match tune signal 316 transitions at a transition time from the off level to the on level at a beginning of the time interval t8 and stays at the on level for the time intervals t8 and t3. The match tune signal 316 transitions at a transition time from the on level to the off level at an end of the time interval t3 and stays at the off level for the time intervals t4 and t9. The match tune signal 316 transitions at an end of the time interval t9 from the off level to the on level and stays at the on level for the time interval t10. As such, the match tune signal 316 periodically transitions between the on level and the off level during the time intervals ta, tb, tc, and td.

Similarly, the RF parameter tune signal 320 is generated in the same manner as the RF parameter tune signal 308 of FIG. 3A except that the RF parameter tune signal 320 is at the on level when the RF parameter tune signal 308 is at the off level and the RF parameter tune signal 320 is at the off level when the RF parameter tune signal 308 is at the on level. For example, the RF parameter tune signal 320 is at the off level during the time interval t1. The RF parameter tune signal 320 transitions at a transition time from the off level to the on level at a beginning of the time interval t2 and stays at the on level for the time intervals t2 and t7. The RF parameter tune signal 320 transitions at a transition time from the on level to the off level at an end of the time interval t7 and stays at the off level during the time intervals t8 and t3. The RF parameter tune signal 320 transitions at a transition time from the off level to the on level at a beginning of the time interval t4 and stays at the on level for the time intervals t4 and t9. The RF parameter tune signal 320 transitions at an end of the time interval t9 from the on level to the off level and stays at the off level for the time interval t10. As such, the RF parameter tune signal 320 periodically transitions between the on level and the off level during the time intervals ta, tb, tc, and td.

Accordingly, the match tune signal 320 is at the off level when the RF parameter tune signal 316 is at the on level and the match tune signal 320 is at the on level when the RF parameter tune signal 316 is at the off level. For example, during the time intervals t1, t8, t3, and t10, the match tune signal 320 is at the on level and the RF parameter tune signal 316 is at the off level. Moreover, during the time intervals t2, t7, t4, and t9, the match tune signal 320 is at the off level and the RF parameter tune signal 316 is at the on level.

Figure 3C:
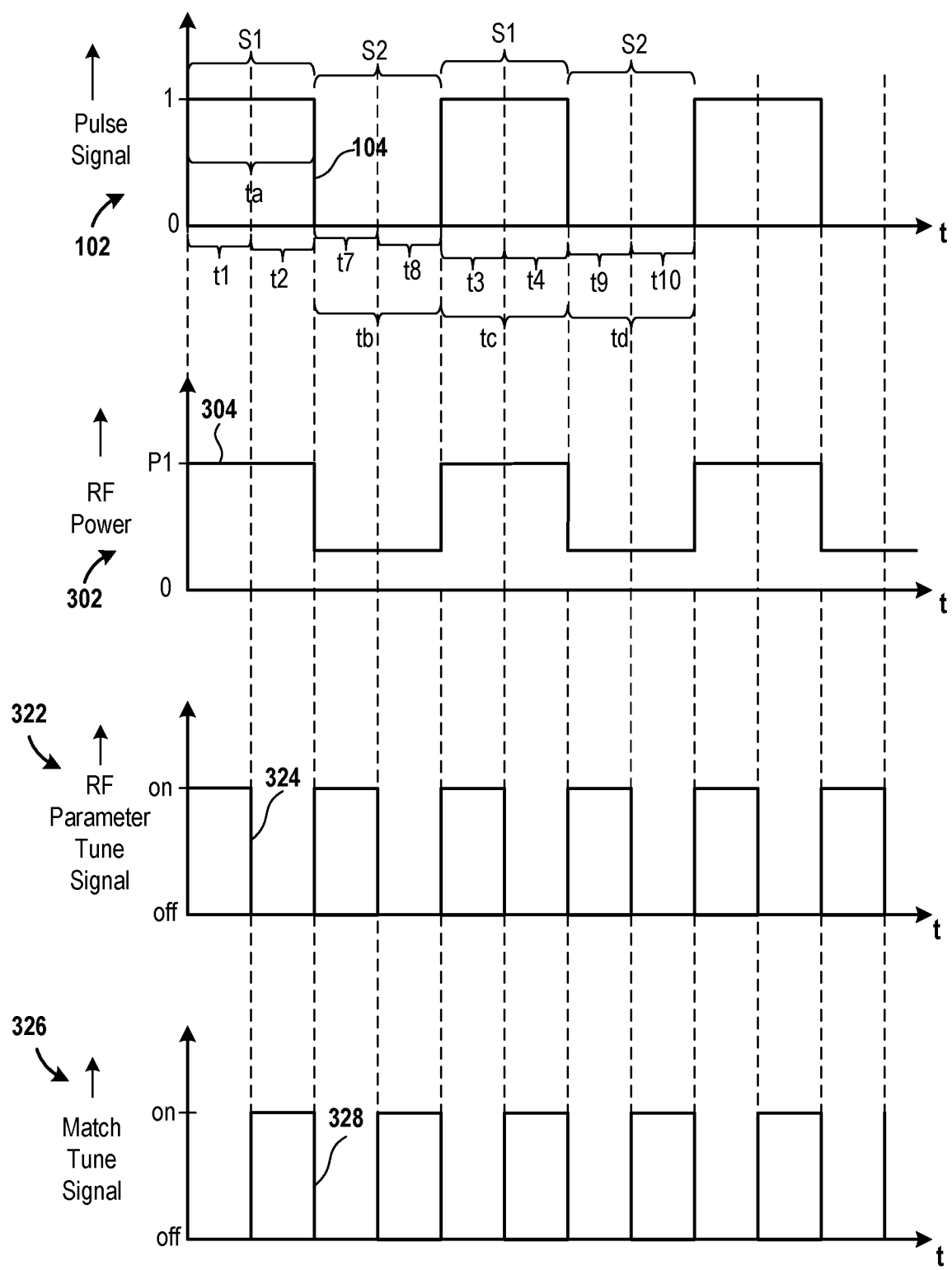
FIG. 3C illustrates embodiments of the graphs to illustrate that the RF generator is tuned during half of the time interval for which the pulse signal is off and the impedance match is tuned during the remaining half of the time interval for which the pulse signal is off.

FIG. 3C illustrates embodiments of the graph 102, the graph 302, a graph 322, and a graph 326 to illustrate that the RF generator is tuned during half of the time interval for which the pulse signal 104 is off and the impedance match is tuned during the remaining half of the time interval for which the pulse signal 104 is off. The graph 322 plots an RF parameter tune signal 324 versus the time t and the graph 326 plots a match tune signal 328 versus the time t.

The RF parameter tune signal 324 is a digital pulse signal indicating a time interval during which the parameter of the RF generator is tuned and a time interval during which the parameter is not tuned. The RF parameter tune signal 324 is generated by the same digital clock oscillator that generates the pulse signal 102 or another digital clock oscillator, examples of which are provided above.

The RF parameter tune signal 324 transitions at a transition time from the off level to the on level at a beginning of the time interval t1 and stays at the on level for the time interval t1. At an end of the time interval t1, the RF parameter tune signal 324 transitions at a transition time from the on level to the off level and stays at the off level for the time interval t2. Moreover, at an end of the time interval t2, the RF parameter tune signal 324 transitions at a transition time from the off level to the on level and stays at the on level for the time interval t7. Also, at an end of the time interval t7, the RF parameter tune signal 324 transitions at a transition time from the on level to the off level and stays at the off level for the time interval t8. At an end of the time interval t8, the RF parameter tune signal 320 transitions from the off level to the on level and stays at the on level for the time interval t3. Moreover, at an end of the time interval t3, the RF parameter tune signal 320 transitions from the on level to the off level and stays at the off level for the time interval t4. At an end of the time interval t4, the RF parameter tune signal 320 transitions from the off level to the on level and stays at the on level for the time interval t9. At an end of the time interval t9, the RF parameter tune signal 320 transitions from the on level to the off level and stays at the off level for the time interval t10. At an end of the time interval t10, the RF parameter tune signal 320 transitions from the off level to the on level.

The match tune signal 328 is a digital pulse signal indicating a time interval during which the variable of the impedance match is tuned and a time interval during which the variable of the impedance match is not tuned. The match tune signal 328 is generated by the digital clock oscillator that generates the pulse signal 102 or the digital clock oscillator that generates the RF parameter tune signal 324 or another digital clock oscillator, examples of which are provided above.

The match tune signal 328 transitions at a transition time from the on level to the off level at a beginning of the time interval t1 and stays at the off level for the time interval t1. At an end of the time interval t1, the match tune signal 328 transitions at a transition time from the off level to the on level and stays at the on level for the time interval t2. Moreover, at an end of the time interval t2, the match tune signal 328 transitions at a transition time from the on level to the off level and stays at the off level for the time interval t7. Also, at an end of the time interval t7, the match tune signal 328 transitions at a transition time from the off level to the on level and stays at the on level for the time interval t8. At an end of the time interval t8, the match tune signal 328 transitions from the on level to the off level and stays at the off level for the time interval t3. Moreover, at an end of the time interval t3, the match tune signal 328 transitions from the on level to the on level and stays at the on level for the time interval t4. At an end of the time interval t4, the match tune signal 328 transitions from the on level to the off level and stays at the off level for the time interval t9. At an end of the time interval t9, the match tune signal 328 transitions from the off level to the on level and stays at the on level for the time interval t10. At an end of the time interval t10, the match tune signal 328 transitions from the on level to the off level.

Accordingly, the match tune signal 328 is at the off level when the RF parameter tune signal 324 is at the on level and the match tune signal 328 is at the on level when the RF parameter tune signal 324 is at the off level. For example, during the time intervals t2, t8, t4, and t10, the match tune signal 328 is at the on level and the RF parameter tune signal 324 is at the off level. Moreover, during the time intervals t1, t7, t3, and t9, the match tune signal 328 is at the off level and the RF parameter tune signal 324 is at the on level.

Figure 3D:
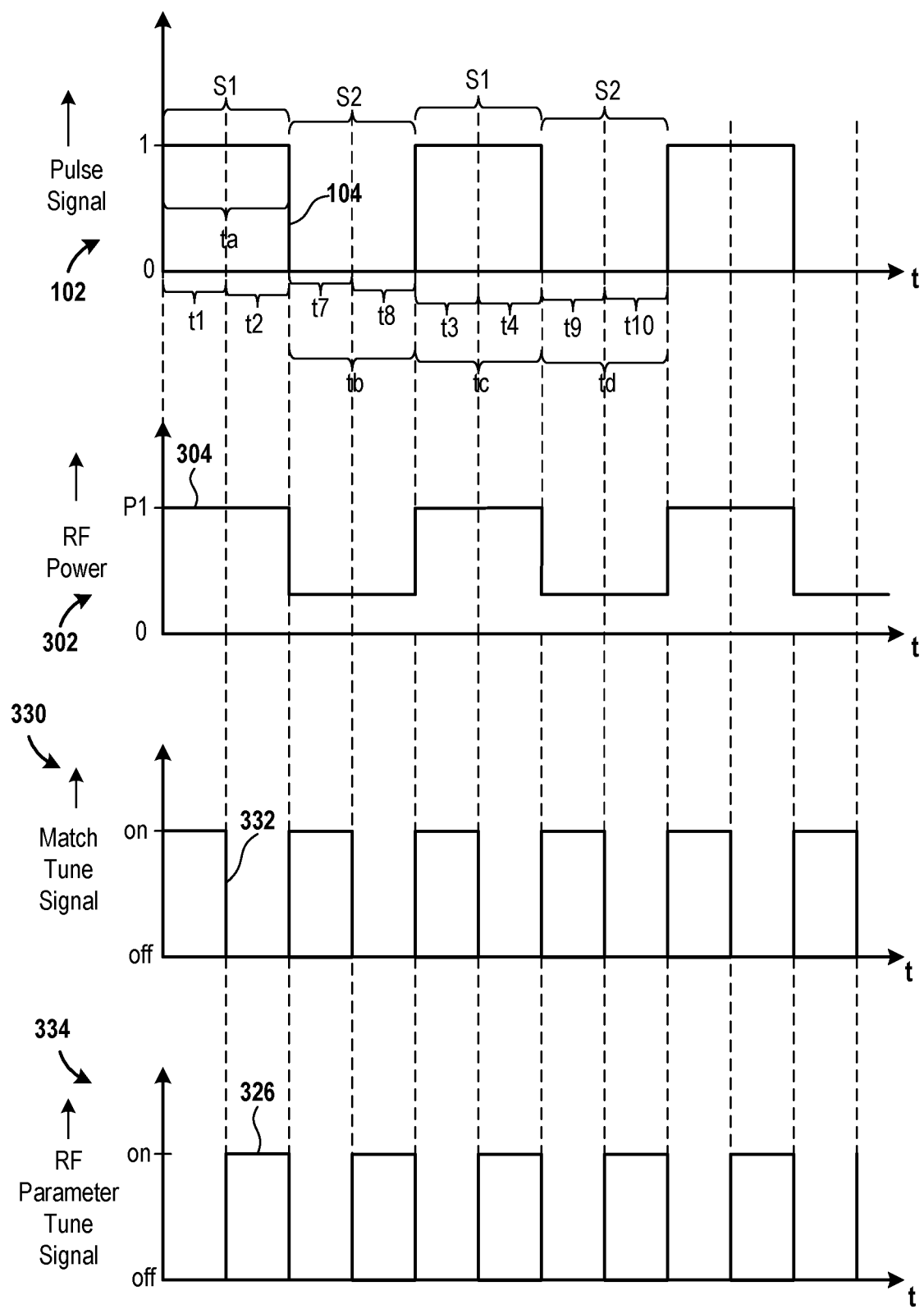
FIG. 3D illustrates embodiments of the graphs to illustrate that the impedance match is tuned during half of the time interval for which the pulse signal is off and the RF generator is tuned during the remaining half of the time interval for which the pulse signal is off.

FIG. 3D illustrates embodiments of the graph 102, the graph 302, a graph 330, and a graph 334 to illustrate that the impedance match is tuned during half of the time interval for which the pulse signal 104 is off and the RF generator is tuned during the remaining half of the time interval for which the pulse signal 104 is off. The graph 330 plots an RF parameter tune signal 332 versus the time t and the graph 334 plots a match tune signal 336 versus the time t.

The match tune signal 336 is the same as the match tune signal 328 of FIG. 3C except that the match tune signal 336 is at the on level when the match tune signal 328 is at the off level and the match tune signal 336 is at the off level when the match tune signal 328 is at the on level. For example, the match tune signal 336 transitions at a transition time from the off level to the on level at a beginning of the time interval t1 and stays at the on level for the time interval t1. At an end of the time interval t1, the match tune signal 336 transitions at a transition time from the on level to the off level and stays at the off level for the time interval t2. Moreover, at an end of the time interval t2, the match tune signal 336 transitions at a transition time from the off level to the on level and stays at the on level for the time interval t7. Also, at an end of the time interval t7, the match tune signal 336 transitions at a transition time from the on level to the off level and stays at the off level for the time interval t8. At an end of the time interval t8, the match tune signal 336 transitions from the off level to the on level and stays at the on level for the time interval t3. Moreover, at an end of the time interval t3, the match tune signal 336 transitions from the on level to the off level and stays at the off level for the time interval t4. At an end of the time interval t4, the match tune signal 336 transitions from the off level to the on level and stays at the on level for the time interval t9. At an end of the time interval t9, the match tune signal 336 transitions from the on level to the off level and stays at the off level for the time interval t10. At an end of the time interval t10, the match tune signal 336 transitions from the off level to the on level.

The RF parameter tune signal 336 is the same as the RF parameter tune signal 324 of FIG. 3C except that the RF parameter tune signal 336 is at the on level when the RF parameter tune signal 324 is at the off level and the RF parameter tune signal 336 is at the off level when the RF parameter tune signal 324 is at the on level. For example, the RF parameter tune signal 336 transitions at a transition time from the on level to the off level at a beginning of the time interval t1 and stays at the off level for the time interval t1. At an end of the time interval t1, the RF parameter tune signal 336 transitions at a transition time from the off level to the on level and stays at the on level for the time interval t2. Moreover, at an end of the time interval t2, the RF parameter tune signal 336 transitions at a transition time from the on level to the off level and stays at the off level for the time interval t7. Also, at an end of the time interval t7, the RF parameter tune signal 336 transitions at a transition time from the off level to the on level and stays at the on level for the time interval t8. At an end of the time interval t8, the RF parameter tune signal 336 transitions from the on level to the off level and stays at the off level for the time interval t3. Moreover, at an end of the time interval t3, the RF parameter tune signal 336 transitions from the off level to the on level and stays at the on level for the time interval t4. At an end of the time interval t4, the RF parameter tune signal 336 transitions from the on level to the off level and stays at the off level for the time interval t9. At an end of the time interval t9, the RF parameter tune signal 336 transitions from the off level to the on level and stays at the on level for the time interval t10. At an end of the time interval t10, the RF parameter tune signal 336 transitions from the on level to the off level.

As such, the match tune signal 332 is at the off level when the RF parameter tune signal 336 is at the on level and the match tune signal 332 is at the on level when the RF parameter tune signal 336 is at the off level. For example, during the time intervals t2, t8, t4, and t10, the match tune signal 332 is at the off level and the RF parameter tune signal 336 is at the on level. Moreover, during the time intervals t1, t7, t3, and t9, the match tune signal 332 is at the on level and the RF parameter tune signal 336 is at the off level.

Figure 4:
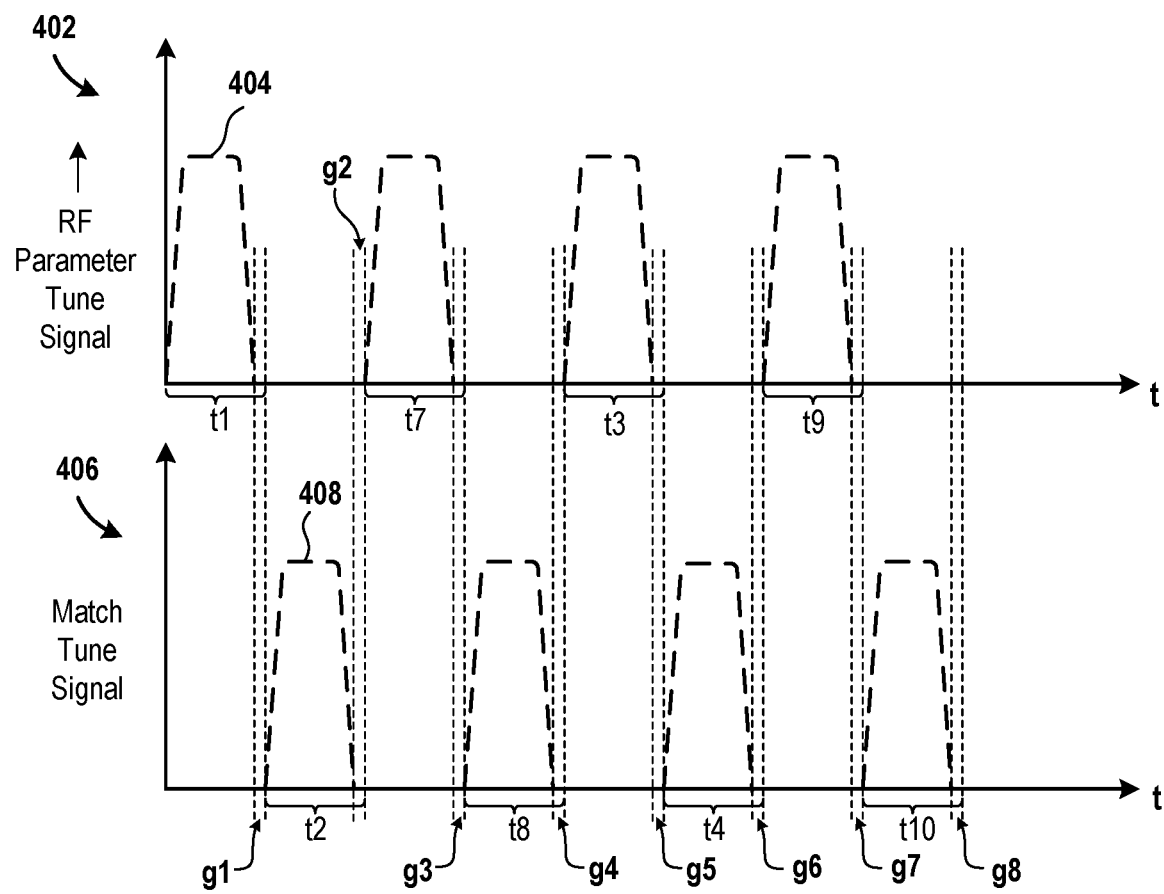
FIG. 4 shows embodiments of graphs to illustrate a non-overlap between an RF parameter tune signal and a match tune signal.

FIG. 4 shows embodiments of a graph 402 and a graph 406 to illustrate a non-overlap between an RF parameter tune signal 404 and a match tune signal 408. The graph 402 plots the RF parameter tune signal 404 versus the time t and the graph 406 plots the match tune signal 408 versus the time t. The RF parameter tune signal 404 is a digital pulse signal that is generated by the same digital clock oscillator that generates the pulse signal 102 (FIGS. 1A-2C) or another digital clock oscillator, examples of which are provided above. The RF parameter tune signal 404 provides a time interval during which the parameter of the RF generator is tuned to tune the parameter of the RF signal 108 (FIGS. 1A-2C) or the RF signal 308 (FIGS. 3A-3D) and a time interval during which the RF generator is not tuned. Similarly, the match tune signal 408 is a digital pulse signal indicating a time interval during which the variable of the impedance match is tuned and a time interval during which the variable of the impedance match is not tuned. The match tune signal 328 is generated by the digital clock oscillator that generates the pulse signal 102 or the digital clock oscillator that generates the RF parameter tune signal 404 or another digital clock oscillator, examples of which are provided above.

There are gaps between tuning of the RF generator using the RF parameter tune signal 404 and tuning of the impedance match using the match tune signal 408. For example, the RF parameter tune signal 404 transitions for a transition time interval from the off level to the on level and remains at the on level for a portion of the time interval t1. The transition time interval from the off level to the on level of the RF parameter tune signal 404 occurs during a portion of the former half of the time interval t1. Before an end of the time interval t1, such as before a gap g1 in the time interval t1, the RF parameter tune signal 404 transitions for a transition time interval from the on level to the off level and remains at the off level during the gap g1 and the time interval t2. The transition time interval from the on level to the off level of the RF parameter tune signal 404 occurs during a portion of the latter half of the time interval t1. It should be noted that the gap g1 is a portion of a latter half of the time interval t1.

Similarly, the RF parameter tune signal 404 transitions for a transition time interval from the off level to the on level and remains at the on level for a portion of the time interval t7. The transition time interval from the off level to the on level of the RF parameter tune signal 404 occurs during a portion of the former half of the time interval t7. Before an end of the time interval t7, such as before a gap g3 in the time interval t7, the RF parameter tune signal 404 transitions for a transition time interval from the on level to the off level and remains at the off level during the gap g3 and the time interval t8. The transition time interval from the on level to the off level of the RF parameter tune signal 404 occurs during a portion of the latter half of the time interval t7. It should be noted that the gap g3 is a portion of a latter half of the time interval t7.

Moreover, the RF parameter tune signal 404 transitions for a transition time interval from the off level to the on level and remains at the on level for a portion of the time interval t3. The transition time interval from the off level to the on level of the RF parameter tune signal 404 occurs during a portion of the former half of the time interval t3. Before an end of the time interval t3, such as before a gap g5 in the time interval t3, the RF parameter tune signal 404 transitions for a transition time interval from the on level to the off level and remains at the off level during the gap g5 and the time interval t4. The transition time interval from the on level to the off level of the RF parameter tune signal 404 occurs during a portion of the latter half of the time interval t3. It should be noted that the gap g5 is a portion of a latter half of the time interval t3.

Also, the RF parameter tune signal 404 transitions for a transition time interval from the off level to the on level and remains at the on level for a portion of the time interval t9. The transition time interval from the off level to the on level of the RF parameter tune signal 404 occurs during a portion of the former half of the time interval t9. Before an end of the time interval t9, such as before a gap g7 in the time interval t9, the RF parameter tune signal 404 transitions for a transition time interval from the on level to the off level and remains at the off level during the gap g7 and the time interval t10. The transition time interval from the on level to the off level of the RF parameter tune signal 404 occurs during a portion of the latter half of the time interval t9. It should be noted that the gap g7 is a portion of a latter half of the time interval t9.

As another example, the match tune signal 408 is at the off level for the time interval t1 and transitions for a transition time interval from the off level to the on level and remains at the on level for a portion of the time interval t2. The transition time interval from the off level to the on level of the match tune signal 408 occurs during a portion of the former half of the time interval t2. Before an end of the time interval t2, such as before a gap g2 in the time interval t2, the match tune signal 408 transitions for a transition time interval from the on level to the off level and remains at the off level during the gap g2 and the time interval t7. The transition time interval from the on level to the off level of the RF match tune signal 408 occurs during a portion of the latter half of the time interval t2. It should be noted that the gap g2 is a portion of a latter half of the time interval t2.

Furthermore, the match tune signal 408 transitions for a transition time interval from the off level to the on level and remains at the on level for a portion of the time interval t8. The transition time interval from the off level to the on level of the match tune signal 408 occurs during a portion of the former half of the time interval t8. Before an end of the time interval t8, such as before a gap g4 in the time interval t8, the match tune signal 408 transitions for a transition time interval from the on level to the off level and remains at the off level during the gap g4 and the time interval t3. The transition time interval from the on level to the off level of the RF match tune signal 408 occurs during a portion of the latter half of the time interval t8. It should be noted that the gap g4 is a portion of a latter half of the time interval t8.

Also, the match tune signal 408 transitions for a transition time interval from the off level to the on level and remains at the on level for a portion of the time interval t4. The transition time interval from the off level to the on level of the match tune signal 408 occurs during a portion of the former half of the time interval t4. Before an end of the time interval t4, such as before a gap g6 in the time interval t4, the match tune signal 408 transitions for a transition time interval from the on level to the off level and remains at the off level during the gap g6 and the time interval t9. The transition time interval from the on level to the off level of the RF match tune signal 408 occurs during a portion of the latter half of the time interval t4. It should be noted that the gap g6 is a portion of a latter half of the time interval t4.

Moreover, the match tune signal 408 transitions for a transition time interval from the off level to the on level and remains at the on level for a portion of the time interval t10. The transition time interval from the off level to the on level of the match tune signal 408 occurs during a portion of the former half of the time interval t10. Before an end of the time interval t10, such as before a gap g8 in the time interval t10, the match tune signal 408 transitions for a transition time interval from the on level to the off level and remains at the off level during the gap g8 and a time interval that consecutively follows the time interval t10. The transition time interval from the on level to the off level of the RF match tune signal 408 occurs during a portion of the latter half of the time interval t10. It should be noted that the gap g8 is a portion of a latter half of the time interval t10.

As such, the RF parameter tune signal 404 and the match tune signal 408 alternatively transition between the on level and the off level with a gap between a transition of the RF parameter tune signal 404 from the on level to the off level and a transition of the match tune signal 408 from the off level to the on level and a gap between a transition of the match tune signal 408 from the on level to the off level and a transition of the RF parameter tune signal 404 from the off level to the on level.

In various embodiments, each gap g1 through g8 has a length of time that occupies more than half, such as the latter half, of corresponding ones of the time intervals t1 through t10. For example, the gap g1 has a length, measured in units of time, that occupies a portion of the time interval t1 that is greater than half of the time interval t1.

It should be noted that a power level, as described herein, of an RF signal is an envelope or a peak-to-peak magnitude of the RF signal. For example, the RF signal is a sinusoidal signal and has the peak-to-peak magnitude. It should further be noted that the variable of impedance match is tuned when a match tune signal is at the on level and is not tuned when the match tune signal is at the off level. Similarly, the parameter of the RF generator is tuned when an RF parameter tune signal is at the on level and is not tuned when the RF parameter tune signal is at the off level.

In some embodiments, the gaps g1 through g8 do not occur. For example, the time interval t1 excludes the gap g1. Similarly, the time interval t2 excludes the gap g2. As yet another example, the match tune signal 408 pulses immediately after pulsing of the RF parameter tune signal 404 and the RF parameter tune signal 404 pulses immediately after pulsing of the match tune signal 408.

In various embodiments, the match tune signal 408 pulses during a duty cycle of the pulse signal 104 before pulsing of the RF parameter tune signal 404 during the duty cycle.

Figure 5A:
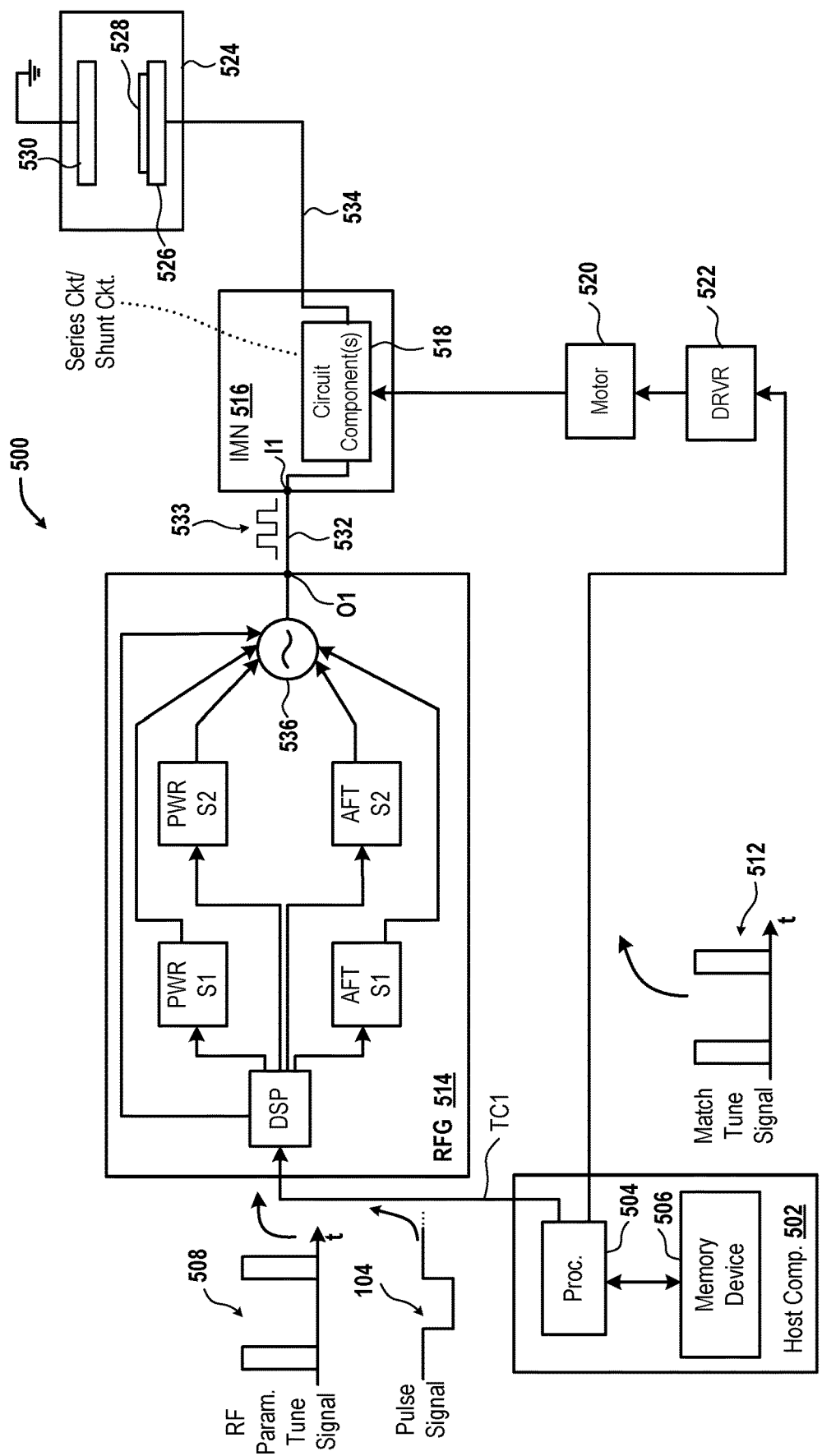
FIG. 5A is a diagram of an embodiment of a system to illustrate a generation of the pulse signal, an RF parameter tune signal, and a match tune signal.

FIG. 5A is a diagram of an embodiment of a system 500 to illustrate a generation of the pulse signal 104, an RF parameter tune signal 508, and a match tune signal 512. Examples of the RF parameter tune signal 508 include the RF parameter tune signal 112 (FIG. 1A), the RF parameter tune signal 120 (FIG. 1B), the RF parameter tune signal 128 (FIG. 1C), the RF parameter tune signal 208 (FIG. 2A), the RF parameter tune signal 216 (FIG. 2B), the RF parameter tune signal 224 (FIG. 2C), the RF parameter tune signal 308 (FIG. 3A), the RF parameter tune signal 320 (FIG. 3B), the RF parameter tune signal 324 (FIG. 3C), the RF parameter tune signal 336 (FIG. 3D), the RF parameter tune signal 404 (FIG. 4), and any other RF parameter tune signal described herein. Examples of the match tune signal 512 include the match tune signal 116 (FIG. 1A), the match tune signal 124 (FIG. 1B), the match tune signal 132 (FIG. 1C), the match tune signal 204 (FIG. 2A), the match tune signal 212 (FIG. 2B), the match tune signal 220 (FIG. 2C), the match tune signal 312 (FIG. 3A), the match tune signal 316 (FIG. 3B), the match tune signal 328 (FIG. 3C), the match tune signal 332 (FIG. 3D), the match tune signal 408 (FIG. 4), and any other match tune signal described herein.

The system 500 includes a host computer 502, an RF generator (RFG) 514, and impedance matching network (IMN) 516, and a plasma chamber 524. The impedance matching network 516 is an example of the impedance match. Examples of the host computer 502 include a desktop computer, a laptop computer, a tablet, or a smart phone. The host computer 502 includes a processor 504 and the memory device 506. The processor 504 is coupled to the memory device 506. As used herein, a processor is an application specific integrated circuit (ASIC), or a programmable logic device (PLD), or a central processing unit (CPU), or a microprocessor, or a tuner, or a digital signal processor, or a logic circuit, or a microcontroller, and in some embodiments, these terms are used interchangeably herein. The logic circuit is configured to execute logic for executing the methods described herein. As used herein, a controller is an ASIC, or a logic circuit, or a PLD, or a CPU, or a microprocessor, or a microcontroller, or a processor. Examples of a memory device include a random access memory (RAM) and a read-only memory (ROM). To illustrate, a memory device is a flash memory, a hard disk, or a storage device, etc. A memory device is an example of a computer-readable medium.

The RF generator 514 includes a digital signal processor (DSP), a power controller (PWRS1) for the state S1, a power controller (PWRS2) for the state S2, and auto frequency tuner (AFTS1) for the state S1, and auto frequency tuner (AFTS2) for the state S2, and an RF power supply 536. An example of the RF power supply 536 is an RF oscillator that generates a sinusoidal signal.

The RF power supply 536 is coupled via an RF cable 532 to multiple circuit components 518 of the impedance matching network 516. Examples of the circuit components 518 include one or more capacitors, or one or more inductors, or one or more resistors, or a combination thereof. To illustrate, one or more capacitors are coupled in series to create a series capacitance of the circuit components 518. As another illustration, a capacitor is coupled in a shunt configuration, where one end of the capacitor is connected to a ground potential and an opposite end of the capacitor is coupled to a conductor that couples the RF cable 532 to an RF transmission line 534. As yet another illustration, one or more capacitors are coupled to each other in series. The one or more capacitors have an end that is coupled to the RF cable 532 and having an opposite end that is coupled to the RF transmission line 534. In addition, a capacitor is coupled in a shunt configuration at one end to the one or more capacitors and is coupled at an opposite end to the ground potential. It should be noted that the circuit components 518 are coupled to each other in a series integration, or in a parallel configuration, or a combination thereof.

The RF cable 532 is a coaxial cable. Moreover the RF transmission line 534 has an RF rod and an RF sheath that surrounds the RF rod with an insulator in between the RF rod and the RF sheath. The RF transmission line 534, in some embodiments, has one or more RF straps and an RF cylinder. The RF rod is coupled to the RF cylinder via the one or more RF straps and the RF cylinder. The RF transmission line 534, such as the RF cylinder of the RF transmission line 534, is coupled to a chuck 526, such as an electrostatic chuck or a pedestal, of the plasma chamber 524. An upper electrode 530 is located opposite to and facing the chuck 526, which includes a lower electrode. For example, the chuck 526 includes a ceramic layer that is attached to a top surface of the lower electrode and a facility plate that is attached to a bottom surface of the lower electrode. The lower electrode is made of a metal, e.g., anodized aluminum, alloy of aluminum, etc. An example of the lower electrode is a grid. Also, the upper electrode 530 is made of a metal. The upper electrode 530 is coupled to the ground potential.

A substrate 528, e.g., a semiconductor wafer, is supported on an upper surface of the chuck 526 for processing of the substrate 528. Integrated circuits, e.g., an ASIC, a PLD, etc., are developed on the substrate 528 and the integrated circuits are used in a variety of devices, e.g., cell phones, tablets, smart phones, computers, laptops, networking equipment, etc.

The system 500 further includes a driver 522, which has one or more transistors to drive a motor 520. The driver 522 is coupled to the motor 520. The motor 520 is an electrical machine that converts electrical energy into mechanical energy. The motor 520 is a direct current (DC) motor or an alternating current (AC) motor. The motor 520 includes a rotor and a stator.

The motor 520 is coupled via a connection mechanism, such as one or more rods, or a combination of one or more gears and one or more rods to the circuit components 518 to control the variable, such as an inductance, or a capacitance, or a resistance, of the circuit components 518. The processor 504 is coupled to the driver 522.

The processor 504 generates the pulse signal 104 and sends the pulse signal 104 via a transfer cable TC1 to the digital signal processor of the RF generator 514. Examples of a transfer cable, as used herein, include a serial transfer cable, a parallel transfer cable, and a universal serial bus (USB) cable. In addition, the processor 504 generates the RF parameter tune signal 508 and provides the RF parameter tune signal 508 via the transfer cable to the digital signal processor of the RF generator 514.

Based on the pulse signal 104, the digital signal processor controls the RF power supply 536 to generate an RF signal 533 having multiple different power levels. For example, the digital signal processor sends a signal to the RF power supply 536 to generate the RF signal 533 having the power level P1 (FIGS. 1A-2C) during the state S1 of the pulse signal 104 and sends a signal to the RF power supply 536 to generate the RF signal 533 having the power level of approximately zero or P2 (FIGS. 3A-3D) during the state S2. Examples of the RF signal 533 includes the RF signal 108 (FIGS. 1A-2D) and the RF signal 304 (FIGS. 3A-3D). Upon receiving the power level P1 or the power level of approximately zero or P2 from the digital signal processor, the RF power supply 536 generates the RF signal 533.

Moreover, based on the RF parameter tune signal 508, during a portion of the state S1 of the pulse signal 104, the digital signal processor of the RF generator 514 sends an RF supply control signal to the power controller PWRS1. For example, during a portion of the time interval to or tb or tc or td (FIGS. 1A-3D), the digital signal processor of the RF generator 514 sends the RF supply control signal to the power controller PWRS1. As another example, during a portion of the time interval tc (FIGS. 1A-3D), the digital signal processor of the RF generator 514 sends the RF supply control signal to the power controller PWRS1. Upon receiving the RF supply control signal during a portion of the state S1, the power controller PWRS1 sends a signal to the RF power supply 536 to tune the RF signal 533 generated by the RF power supply 536. The signal sent to the RF power supply 536 includes a predetermined range of values of power of the RF signal 533 for a portion of the state S1. The predetermined range of values of power of the RF signal 533 for a portion of the state S1 corresponds to a factor, such as plasma impedance, reflected power, supply power, voltage standing wave ratio, or delivered power, to be achieved at one or more locations in the system 500 during the portion of the state S1. Examples of the one or more locations include an output O1 of the RF power supply 536, a point on the RF cable 532, an input I1 of the impedance matching network 516, an output of the impedance matching network 516, a point on the RF transmission line 534, or a top or bottom surface of the chuck 526 or a location within the plasma chamber 524. The correspondence between the factor and the predetermined range of values of power for a portion of the state S1 is stored in a memory device of the power controller PWRS1 for access by a processor of the power controller PWRS1. Upon receiving the signal from the power controller PWRS1, the RF power supply 536 modifies, during a portion of the state S1, values of power of the RF signal 533 to be within the predetermined range of values of power to tune the RF signal 533. The predetermined range of values of power for a portion of the state S1 is within a preset percentage, such as between zero and 10%, of power values, such as peak-to-peak values, of the RF signal 533 during the state S1.

Moreover, based on the RF parameter tune signal 508, during any remaining portion of the state S1 of the pulse signal 104, the digital signal processor of the RF generator 514 does not send the RF supply control signal to the power controller PWRS1. When the RF supply control signal is not sent to the power controller PWRS1, the power controller PWRS1 does not send the signal during the remaining portion of the state S1 to the RF power supply 536 to avoid any tuning of power of the RF power supply 536 for the remaining portion of the state S1.

Similarly, based on the RF parameter tune signal 508, during a portion of the state S2 of the pulse signal 104, the digital signal processor of the RF generator 514 sends an RF supply control signal to the power controller PWRS2. For example, during a portion of the time interval tb (FIGS. 1A-3D), the digital signal processor of the RF generator 514 sends the RF supply control signal to the power controller PWRS2. As another example, during a portion of the time interval td (FIGS. 1A-3D), the digital signal processor of the RF generator 514 sends the RF supply control signal to the power controller PWRS2. Upon receiving the RF supply control signal during a portion of the state S2, the power controller PWRS2 sends a signal to the RF power supply 536 to tune the RF signal 533 generated by the RF power supply 536. The signal sent to the RF power supply 536 includes a predetermined range of values of power of the RF signal 533 for a portion of the state S2. The predetermined range of values of power of the RF signal 533 for a portion of the state S2 corresponds to the factor to be achieved at the one or more locations in the system 500 during the portion of the state S2. The correspondence between the factor and the predetermined range of values of power for a portion of the state S2 is stored in a memory device of the power controller PWRS2 for access by a processor of the power controller PWRS2. Upon receiving the signal from the power controller PWRS2, the RF power supply 536 modifies, during a portion of the state S2, values of power of the RF signal 533 to be within the predetermined range of values of power to tune the RF signal 533. The predetermined range of values of power for a portion of the state S2 is within the preset percentage of power values, such as peak-to-peak values, of the RF signal 533 during the state S2.

Also, based on the RF parameter tune signal 508, during any remaining portion of the state S2 of the pulse signal 104, the digital signal processor of the RF generator 514 does not send the RF supply control signal to the power controller PWRS2. When the RF supply control signal is not sent to the power controller PWRS2, the power controller PWRS2 does not send the signal during the remaining portion of the state S2 to the RF power supply 536 to avoid any tuning of power of the RF power supply 536 for the remaining portion of the state S2.

Similarly, based on the RF parameter tune signal 508, during a portion of the state S1 of the pulse signal 104, the digital signal processor of the RF generator 514 sends an RF supply control signal to the auto frequency tuner AFTS1. For example, during a portion of the time interval ta, the digital signal processor of the RF generator 514 sends the RF supply control signal to the auto frequency tuner AFTS1. As another example, during a portion of the time interval tc, the digital signal processor of the RF generator 514 sends the RF supply control signal to the auto frequency tuner AFTS1. Upon receiving the RF supply control signal during a portion of the state S1, the auto frequency tuner AFTS1 sends a signal to the RF power supply 536 to tune the RF signal 533 generated by the RF power supply 536. The signal sent to the RF power supply 536 includes a predetermined range of values of frequencies of the RF signal 533 for a portion of the state S1. The predetermined range of values of frequencies of the RF signal 533 for a portion of the state S1 corresponds to the factor to be achieved at the one or more locations in the system 500 during the portion of the state S1. The correspondence between the factor and the predetermined range of values of frequencies for a portion of the state S1 is stored in a memory device of the auto frequency tuner AFTS1 for access by a processor of the auto frequency tuner AFTS1. Upon receiving the signal from the auto frequency tuner AFTS1, the RF power supply 536 modifies, during a portion of the state S1, values of frequencies of the RF signal 533 to be within the predetermined range of values of frequencies to tune the RF signal 533. The predetermined range of values of frequencies for a portion of the state S1 is within a preset percentage, such as between zero and 10%, of frequency values of the RF signal 533.

Moreover, based on the RF parameter tune signal 508, during any remaining portion of the state S1 of the pulse signal 104, the digital signal processor of the RF generator 514 does not send the RF supply control signal to the auto frequency tuner AFTS1. When the RF supply control signal is not sent to the auto frequency tuner AFTS1, the auto frequency tuner AFTS1 does not send the signal during the remaining portion of the state S1 to the RF power supply 536 to avoid any tuning of frequencies of the RF power supply 536 for the remaining portion of the state S1.

Similarly, based on the RF parameter tune signal 508, during a portion of the state S2 of the pulse signal 104, the digital signal processor of the RF generator 514 sends an RF supply control signal to the auto frequency tuner AFTS2. For example, during a portion of the time interval tb, the digital signal processor of the RF generator 514 sends the RF supply control signal to the auto frequency tuner AFTS2. As another example, during a portion of the time interval td, the digital signal processor of the RF generator 514 sends the RF supply control signal to the auto frequency tuner AFTS2. Upon receiving the RF supply control signal during a portion of the state S2, the auto frequency tuner AFTS2 sends a signal to the RF power supply 536 to tune the RF signal 533 generated by the RF power supply 536. The signal sent to the RF power supply 536 includes a predetermined range of values of frequencies of the RF signal 533 for a portion of the state S2. The predetermined range of values of frequencies of the RF signal 533 for a portion of the state S2 corresponds to the factor to be achieved at the one or more locations in the system 500 during the portion of the state S2. The correspondence between the factor and the predetermined range of values of frequencies for a portion of the state S2 is stored in a memory device of the auto frequency tuner AFTS2 for access by a processor of the auto frequency tuner AFTS2. Upon receiving the signal from the auto frequency tuner AFTS2, the RF power supply 536 modifies, during a portion of the state S2, values of frequencies of the RF signal 533 to be within the predetermined range of values of frequencies to tune the RF signal 533. The predetermined range of values of frequencies for a portion of the state S2 is within the preset percentage of frequency values of the RF signal 533.

Moreover, based on the RF parameter tune signal 508, during any remaining portion of the state S2 of the pulse signal 104, the digital signal processor of the RF generator 514 does not send the RF supply control signal to the auto frequency tuner AFTS2. When the RF supply control signal is not sent to the auto frequency tuner AFTS2, the auto frequency tuner AFTS2 does not send the signal during the remaining portion of the state S2 to the RF power supply 536 to avoid any tuning of frequencies of the RF power supply 536.

The processor 504 generates and sends the match tune signal 512 to the driver 522. Upon receiving the match tune signal 522, during a portion of the state S1, the driver 522 sends a driver signal to the motor 520 to turn on the motor for the portion of the state S1. For example, upon receiving the match tune signal 522, during a portion of the time interval ta, the driver 522 generates and sends a driver signal to the motor 520. As another example, upon receiving the match tune signal 522, during a portion of the time interval tc, the driver 522 generates and sends a driver signal to the motor 520. The motor 520 is turned on upon receiving a driver signal for a portion of the state S1. When the motor 520 is turned on for a portion of the state S1, the rotor rotates with respect to the stator to change the variable of the circuit components 518. For example, a capacitance of the circuit components 518 is changed when the rotor rotates to change an area between plates of a capacitor of the circuit components 518. As another example, an inductance of the circuit components 518 is changed when the rotor rotates to change a position of a core with respect to windings of the inductor. The windings surround the core. When the variable is changed for a portion of the state S1, the variable is tuned for the portion of the state S1. The RF power supply 536 is not tuned during a portion of a time interval of the state S1 in which the variable of the circuit components 518 is tuned.

For any remaining portion of the state S1 in which the RF power supply 536 is tuned to tune the RF signal 533, the driver 522 does not send a driver signal to the motor 520. When the driver signal is not received, the motor 520 is turned off for the remaining portion of the state S1. When the motor 520 is turned off for the remaining portion of the state S1, the variable of the circuit components 518 is not tuned for the remaining portion of the state S1.

Similarly, upon receiving the match tune signal 522, during a portion of the state S2, the driver 522 sends a driver signal to the motor 520 to turn on the motor for the portion of the state S2. For example, upon receiving the match tune signal 522, during a portion of the time interval tb, the driver 522 generates and sends a driver signal to the motor 520. As another example, upon receiving the match tune signal 522, during a portion of the time interval td, the driver 522 generates and sends a driver signal to the motor 520. The motor 520 is turned on upon receiving a driver signal for a portion of the state S2. When the motor 520 is turned on for a portion of the state S2, the rotor rotates with respect to the stator to change the variable of the circuit components 518. When the variable is changed for a portion of the state S2, the variable is tuned. The RF power supply 536 is not tuned during a portion of a time interval of the state S2 in which the variable of the circuit components 518 is tuned.

For any remaining portion of the state S2 in which the RF power supply 536 is tuned to tune the RF signal 533, the driver 522 does not send a driver signal to the motor 520. When the driver signal is not received, the motor 520 is turned off for the remaining portion of the state S2. When the motor 520 is turned off for the remaining portion of the state S2, the variable of the circuit components 518 is not tuned for the remaining portion of the state S2.

The RF signal 533 that is tuned according to the RF parameter tune signal 508 is supplied via the RF cable 532 to the circuit components 518 having the variable that is tuned according to the match tune signal 512. The circuit components 518 match an impedance of a load that is coupled to the output of the impedance match with an impedance of a source that is coupled to the input I1 of the impedance match. Examples of the load include the plasma chamber 524, plasma when lit within the plasma chamber 524, and the RF transmission line 534. Examples of the source include the RF cable 532 and the RF generator 514.

The circuit components 518 that are tuned to tune the variable match the impedance of the load with that of the source to generate a modified RF signal at the output of the impedance match. The modified RF signal is supplied via the RF transmission line 534 to the chuck 526. When one or more process gases are supplied from a gas supply (not shown) to a gap between the upper electrode 530 and the chuck 526 in the plasma chamber 524, and the modified RF signal is supplied to the plasma chamber 524, plasma is stricken or maintained within the plasma chamber 524. Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc. The plasma within the plasma chamber 524 is used to process, such as deposit materials on, etch, sputter, or clean, the substrate 528.

In some embodiments, the power controllers PWRS1 and PWRS2, and the auto frequency tuners AFTS1 and AFTS2, are modules, such as logic modules, of a computer program that is executed by the digital signal processor of the RF generator 514. In various embodiments, the digital signal processor of the RF generator 514, the power controllers PWRS1 and PWRS2, and the auto frequency tuners AFTS1 and AFTS2, are integrated within a processor or a controller. In some embodiments, each of the power controller PWRS1, the power controller PWRS2, the auto frequency tuner AFTS1, and the auto frequency tuner AFTS2 is a controller that executes logic and the controller has a memory device for storing the logic and/or data for processing the logic. In these embodiments, the RF generator 514 does not have the digital signal processor and each of the controllers is coupled to the processor 504. For example, the power controller PWRS1 is a controller, the power controller PWRS2 is a controller, the auto frequency tuner AFTS1 is a controller, and the auto frequency tuner AFTS2 is a controller.

In various embodiments, the driver 522 is integrated within the processor 504. For example, the driver 522 is a part of the processor 504.

It should be noted that in some embodiments, during a time period in which the circuit components 518 match the impedance of the load coupled to the impedance match with an impedance of the source, the variable of the circuit components 518 is being tuned by the match tune signal 512.

In some embodiments, the variable of the circuit components 518 is tuned by the match tune signal 512 before or after the circuit components 518 match the impedance of the load with the impedance of the source.

In several embodiments, based on the RF parameter tune signal 508, for the state S1 of the pulse signal 104, the digital signal processor of the RF generator 514 does not send the RF supply control signal to the power controller PWRS1. When the RF supply control signal is not sent to the power controller PWRS1, the power controller PWRS1 does not send the signal during the state S1 to the RF power supply 536 to avoid any tuning of power of the RF power supply 536 for the state S1.

In several embodiments, based on the RF parameter tune signal 508, for the state S1 of the pulse signal 104, the digital signal processor of the RF generator 514 does not send the RF supply control signal to the auto frequency tuner AFTS1. When the RF supply control signal is not sent to the auto frequency tuner AFTS1, the auto frequency tuner AFTS1 does not send the signal during the state S1 to the RF power supply 536 to avoid any tuning of power of the RF power supply 536 for the state S1.

Similarly, in some embodiments, based on the RF parameter tune signal 508, for the state S2 of the pulse signal 104, the digital signal processor of the RF generator 514 does not send the RF supply control signal to the power controller PWRS2. When the RF supply control signal is not sent to the power controller PWRS2, the power controller PWRS2 does not send the signal during the state S2 to the RF power supply 536 to avoid any tuning of power of the RF power supply 536 for the state S2.

In several embodiments, based on the RF parameter tune signal 508, for the state S2 of the pulse signal 104, the digital signal processor of the RF generator 514 does not send the RF supply control signal to the auto frequency tuner AFTS2. When the RF supply control signal is not sent to the auto frequency tuner AFTS2, the auto frequency tuner AFTS2 does not send the signal during the state S2 to the RF power supply 536 to avoid any tuning of power of the RF power supply 536 for the state S2.

In some embodiments, for the state S1 in which the RF power supply 536 is tuned to tune the RF signal 533, the driver 522 does not send a driver signal to the motor 520. When the driver signal is not received, the motor 520 is turned off for the state S1. When the motor 520 is turned off for the state S1, the variable of the circuit components 518 is not tuned during the state S1.

In various embodiments, for the state S2 in which the RF power supply 536 is tuned to tune the RF signal 533, the driver 522 does not send a driver signal to the motor 520. When the driver signal is not received, the motor 520 is turned off for the state S2. When the motor 520 is turned off for the state S2, the variable of the circuit components 518 is not tuned during the state S2.

Figure 5B:
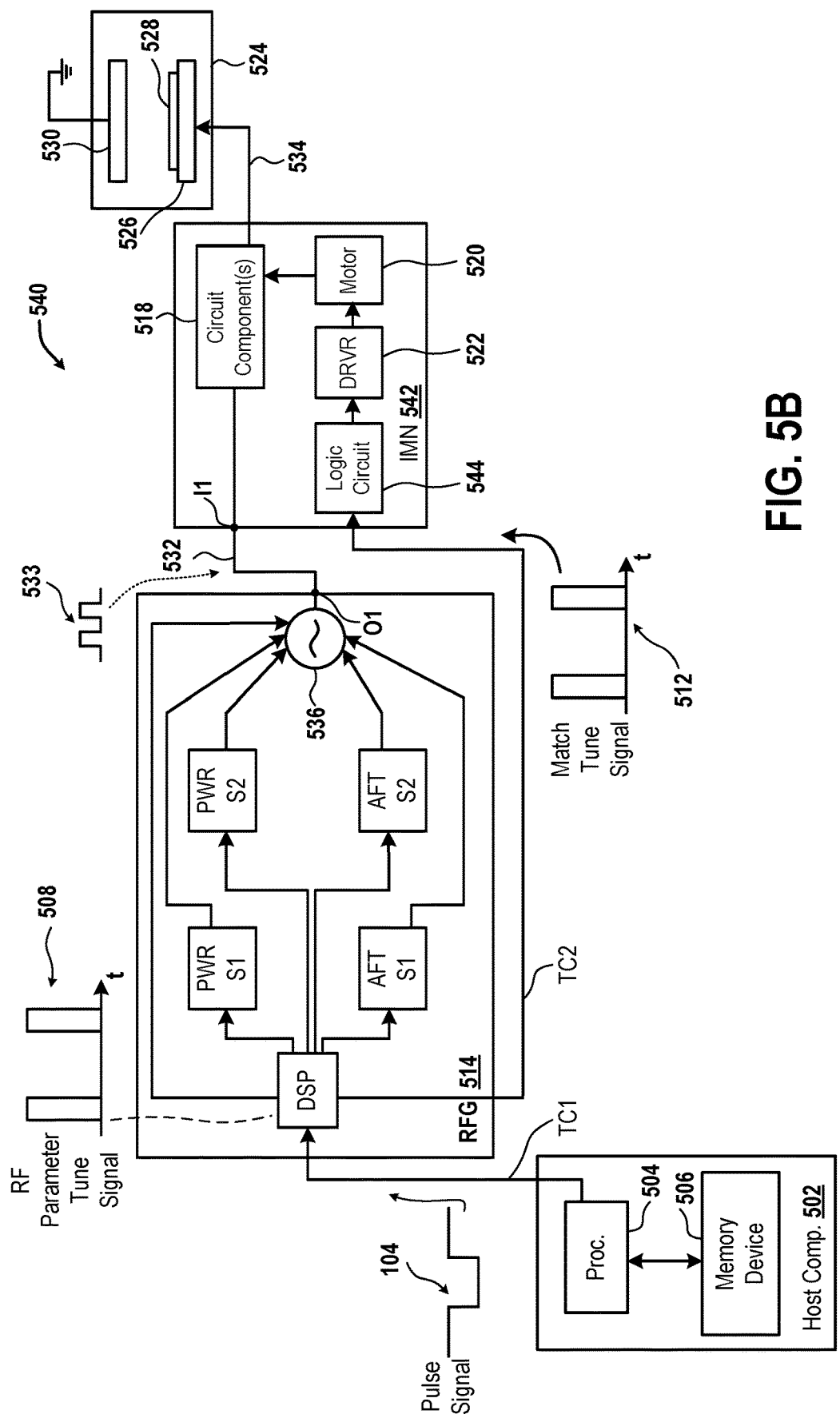
FIG. 5B is a diagram of an embodiment of a system to illustrate a logic circuit of the impedance match for applying the match tune signal to change a variable of circuit components of the impedance match.

FIG. 5B is a diagram of an embodiment of a system 540 to illustrate a logic circuit 544 of an impedance matching network 542 for applying the match tune signal 512 to change the variable of the circuit components 518. The impedance matching network 542 is an example of the impedance match. The system 540 includes the host computer 502, the RF generator 514, the impedance matching network 542, and the plasma chamber 524. The impedance matching network 542 includes the driver 522 and the motor 520. An example of the logic circuit 544 is an ASIC, or a PLD, or a processor.

The processor 504 sends the pulse signal 104 via the transfer cable TC1 to the digital signal processor of the RF generator 514. The digital signal processor of the RF generator 514 generates the RF parameter tune signal 508 from the pulse signal 104 and also generates the match tune signal 512 from the pulse signal 104. For example, the digital signal processor of the RF generator 514 generates the RF parameter tune signal 508 and the match tune signal 512 so that a pulse of the RF parameter tune signal 508 does not coincide with a pulse of the match tune signal 512 and both the RF parameter tune signal 508 and the match in signal 512 are synchronized with the pulse signal 104. For example, during a portion of the state S1 of the pulse signal 104, the digital signal processor of the RF generator 514 generates a pulse the RF parameter tune signal 508 and during the remaining portion of the state S1 of the pulse signal 104, the digital signal processor generates a pulse of the match tune signal 512, and pulses of the RF parameter tune signal 508 and the match tune signal 512 are not generated during the state S2. As another example, during a portion of the state S2 of the pulse signal 104, the digital signal processor of the RF generator 514 generates a pulse the RF parameter tune signal 508 and during the remaining portion of the state S2 of the pulse signal 104, the digital signal processor generates a pulse of the match tune signal 512.

The digital signal processor of the RF generator 514 controls the RF power supply 536, the power controllers PWRS1 and PWRS2, and/or the auto frequency tuners AFTS1 and AFTS2 in a manner described above so that the RF power supply 536 generates the RF signal 533 that is tuned based on the RF parameter tune signal 508. Moreover, the logic circuit 544 of the impedance matching network 546 receives the match tune signal 512 via a transfer cable TC2 that couples the digital signal processor of the RF generator 514 to the logic circuit 544. The logic circuit 544 receives the match tune signal 512 from the digital signal processor of the RF generator 514. The logic circuit 544 provides the match tune signal 512 to the driver 522 to control the circuit components 518 to further tune the variable of the circuit components 518 in a manner described above. For example, the logic circuit 544 controls the circuit components 518 via the motor 520 and the driver 522 in the same manner in which the processor 504 controls the circuit components 518 via the driver 522 and the motor 520.

Figure 5C:
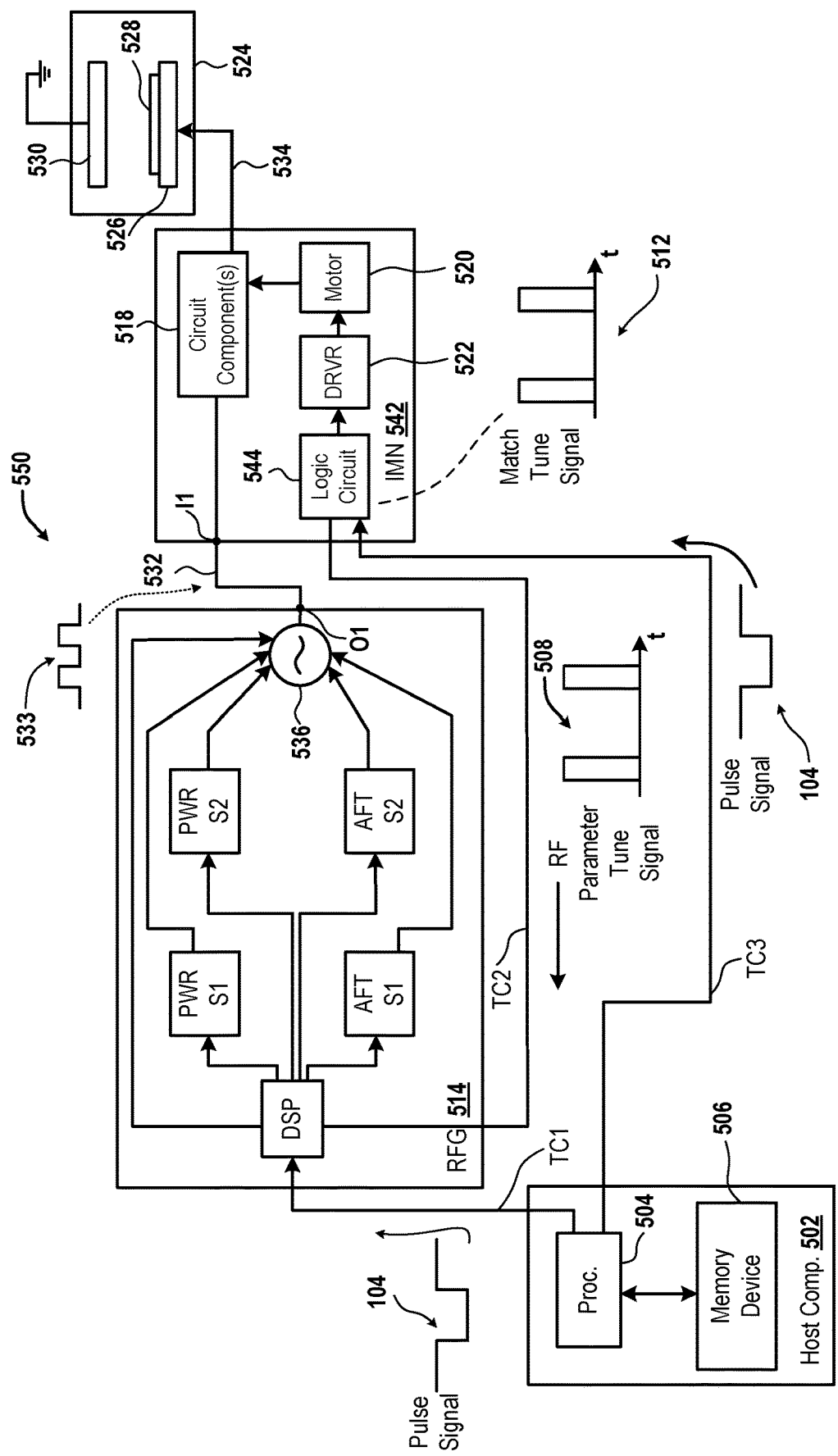
FIG. 5C is a diagram of an embodiment of a system to illustrate that the logic circuit generates the match tune signal from the pulse signal and further generates the RF parameter tune signal from the pulse signal.

FIG. 5C is a diagram of an embodiment of the system 550 to illustrate that the logic circuit 544 generates the match tune signal 512 from the pulse signal 104 and further generates the RF parameter tune signal 508 from the pulse signal 104. The system 550 includes the host computer 502, the RF generator 514, the impedance matching network 542, and the plasma chamber 524. The logic circuit 544 is coupled to the processor 504 via a transfer cable TC3, examples of which are provided above.

The logic circuit 544 receives the pulse signal 104 via the transfer cable TC3 from the processor 504 and generates the RF parameter tune signal 508 and the match tune signal 512 from the pulse signal 104 in the same manner in which the digital signal processor of the RF generator 514 generates the signals 508 and 512 from the pulse signal 104. The logic circuit 544 supplies the RF parameter tune signal 508 to the digital signal processor of the RF generator 514 via the transfer cable TC2. Upon receiving the RF parameter tune signal 508 from the logic circuit 544, the digital signal processor of the RF generator 514 tunes the RF signal 533 via the power controllers PWRS1 and PWRS2, and/or via the auto frequency tuners AFTS1 and AFTS2 based on the RF parameter tune signal 508. Moreover, the logic circuit 544 tunes the variable of the circuit components 518 via the driver 522 and the motor 520 according to the match tune signal 512.

Figure 5D:
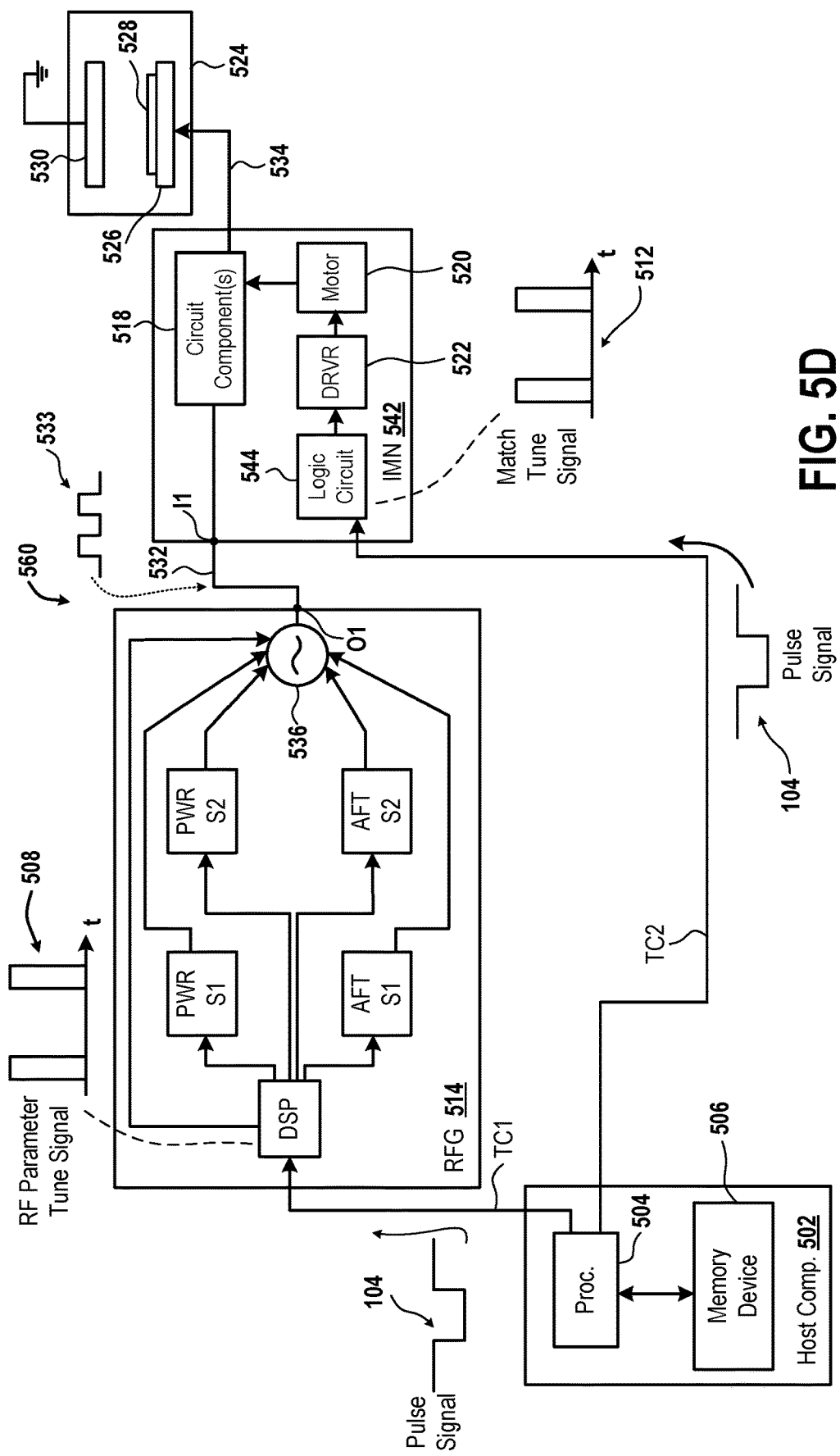
FIG. 5D is a diagram of an embodiment of a system to illustrate generation of the match tune signal from the pulse signal by the logic circuit of the impedance match and generation of the RF parameter tune signal from the pulse signal by a digital signal processor of the RF generator.

FIG. 5D is a diagram of an embodiment of a system 560 to illustrate generation of the match tune signal 512 from the pulse signal 104 by the logic circuit 544 of the impedance matching network 542 and generation of the RF parameter tune signal 508 from the pulse signal 104 by the digital signal processor of the RF generator 514. The system 516 includes the host computer 502, the RF generator 514, the impedance matching network 542, and the plasma chamber 524. The processor 504 provides the pulse signal 104 via the transfer cable TC1 to the digital signal processor of the RF generator 514 and also provides the pulse signal 104 via the transfer cable TC2 to the logic circuit 544. In addition, the processor 504 provides instructions to the digital signal processor to generate the RF parameter tune signal 508 to avoid any overlap between pulses of the RF parameter tune signal 508 and pulses of the match tune signal 512. As an example, the instructions include time intervals for which the pulses of the match tune signal 512 are generated and time intervals for which the pulses of the match tune signal 512 are not generated and/or time intervals for which pulses of the RF parameter tune signal 508 are generated and time intervals for which the pulses of the RF parameter tune signal 508 are not generated, or a combination thereof. Moreover, the processor provides the same instructions to avoid the overlap to the logic circuit 544 via the transfer cable TC2.

Upon receiving the pulse signal 104 and the instructions from the processor 504, the digital signal processor of the RF generator 514 generates the RF parameter tune signal 508 and the logic circuit 544 or generates the match tune signal 512. The digital signal processor controls the power controllers PWRS1 and PWRS2, the auto frequency tuners AFTS1 and AFTS2, or a combination thereof, to tune the RF power supply 436 to further tune the RF signal 533. In addition, the logic circuit 544 tunes the variable of the circuit components 518 according to the match tune signal 512 via the driver 522 and the motor 520.

Figure 5E:
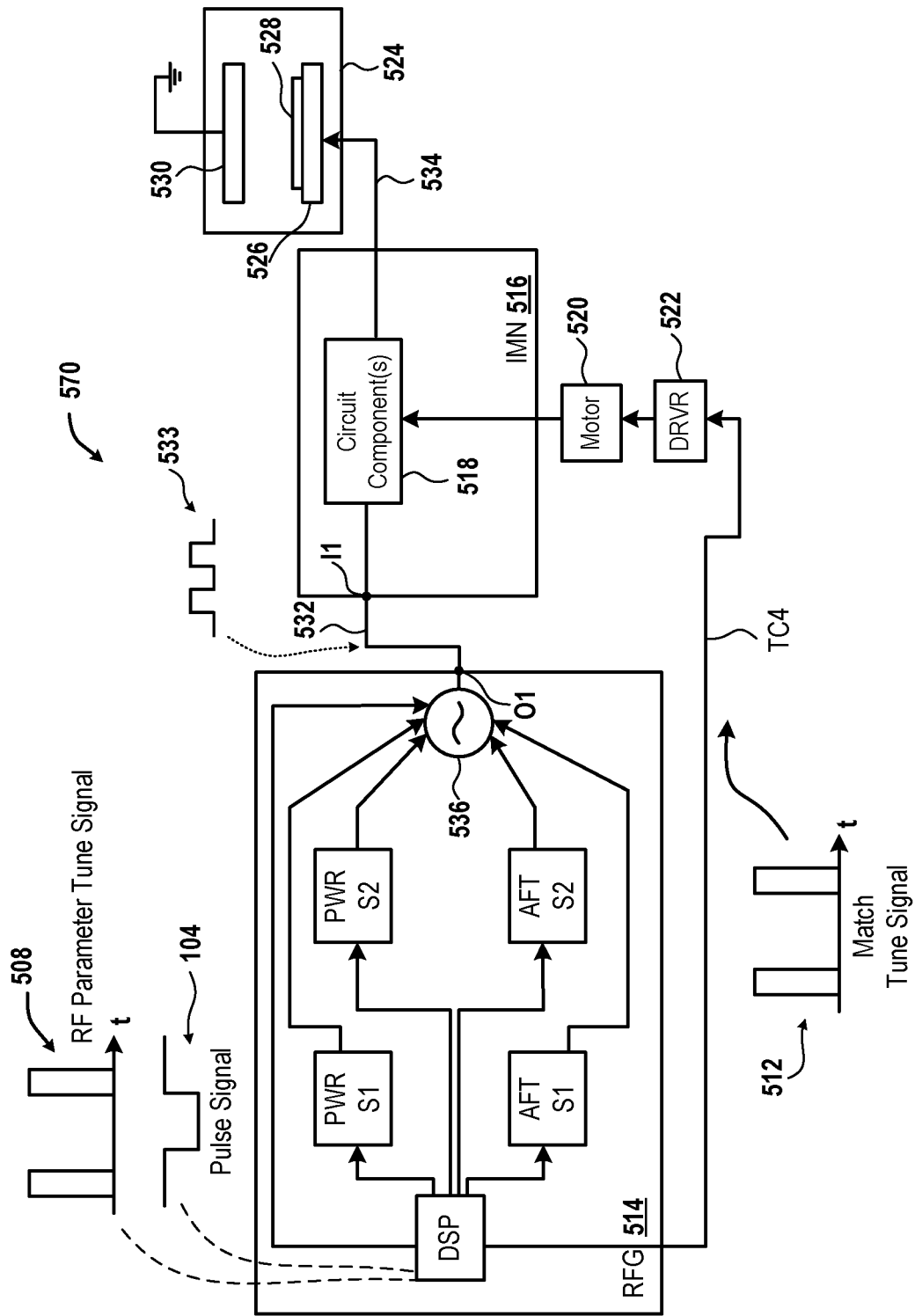
FIG. 5E is a diagram of an embodiment of a system to illustrate tuning of the circuit components by the digital signal processor of the RF generator.

FIG. 5E is a diagram of an embodiment of a system 570 to illustrate tuning of the circuit components 518 by the digital signal processor of the RF generator 514. It should be noted that the system 570 does not include the host computer 502.

The system 570 includes the RF generator 514, the driver 522, the motor 520, the impedance matching network 516, and the plasma chamber 524. The digital signal processor of the RF generator 514 is coupled to the driver 522 via a transfer cable TC4.

The digital signal processor of the RF generator 514 generates the pulse signal 104 and based on the pulse signal 104 generates the RF parameter tune signal 508 and the match tune signal 512 in a manner described above. The digital signal processor controls the RF power supply 536 to generate the RF signal 533 in synchronization with the pulse signal 104. In addition, the digital signal processor of the RF generator 514 tunes the RF signal 533 by controlling the power controllers PWRS1 and PWRS2, or the auto frequency tuners AFTS1 and AFTS2, or a combination thereof.

The digital signal processor of the RF generator 514 sends the match tune signal 512 via the transfer cable TC4 to the driver 522. Upon receiving the match tune signal 512, the driver 522 is turned on or off to further turn on or off the motor 522 to tune or not tune the variable of the circuit components 518.

In some embodiments, the driver 522 is a part of the digital signal processor of the RF generator 514. For example, the driver 522 is integrated within a circuit of the digital signal processor of the RF generator 514.

Figure 5F:
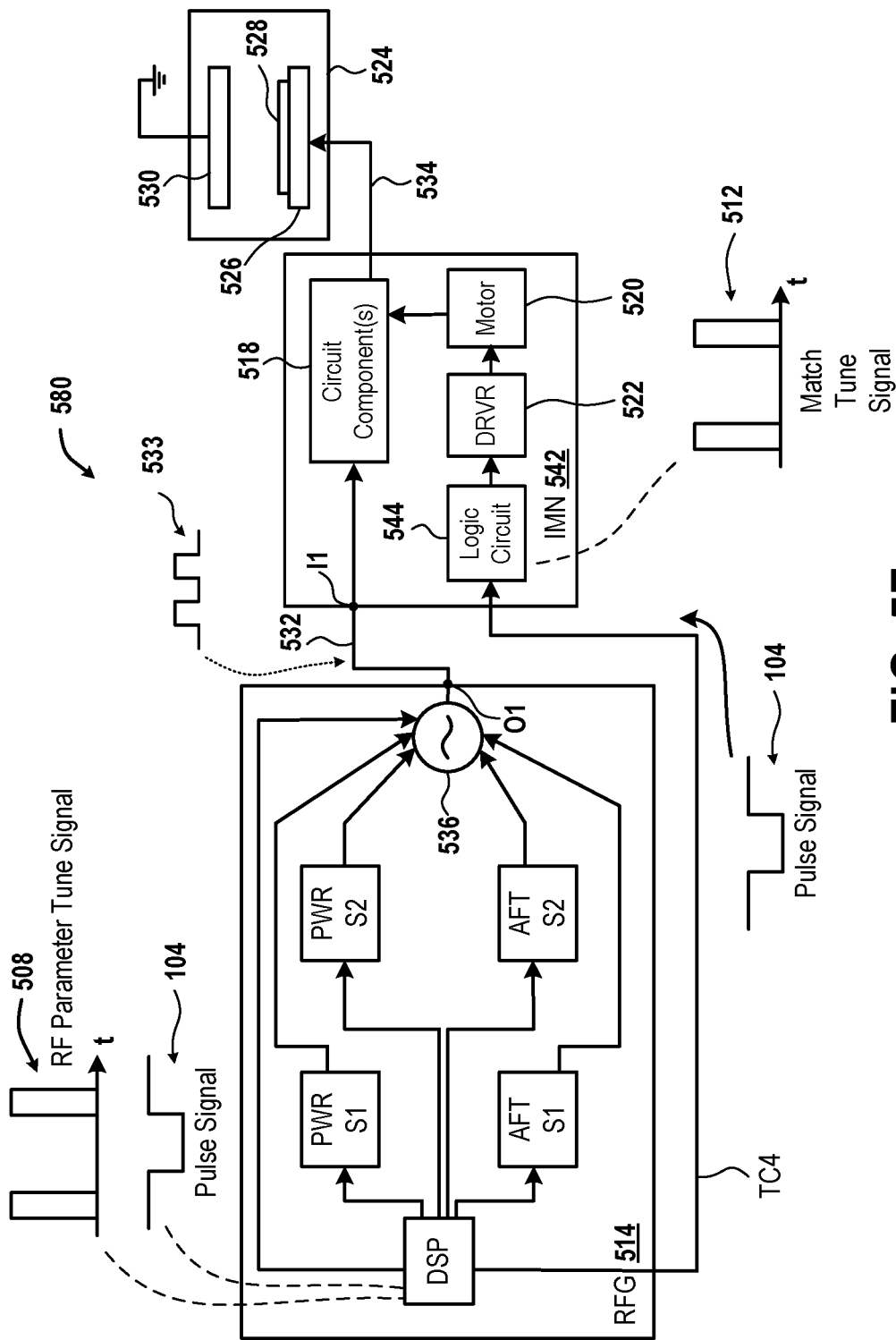
FIG. 5F is a diagram of an embodiment of a system to illustrate generation of the match tune signal based on the pulse signal that is received by the logic circuit from the digital signal processor of the RF generator.

FIG. 5F is a diagram of an embodiment of a system 580 to illustrate generation of the match tune signal 512 based on the pulse signal 104 that is received by the logic circuit 544 from the digital signal processor of the RF generator 514. The system 580 includes the RF generator 514, the impedance matching network 542, and the plasma chamber 524. The digital signal processor of the RF generator 514 generates the pulse signal 104 and from the pulse signal 104 generates the RF parameter tune signal 508. Moreover, the digital signal processor of the RF generator 514 supplies the pulse signal 104 via the transfer cable TC4 to the logic circuit 544. In addition, the digital signal processor of the RF generator 514 provides the instructions by the transfer cable TC4 to the logic circuit 544 for generating the match tune signal 512 from the pulse signal 104 such that pulses of the match tune signal 512 do not coincide with pulses of the RF parameter tune signal 508. Upon receiving the instructions and the pulse signal 104, the logic circuit 544 applies the instructions to the pulse signal 104 to generate the match tune signal 512 from the pulse signal 104.

The digital signal processor of the RF generator 514 tunes the RF signal 533 generated by the RF power supply 536 according to the RF parameter tune signal 508 via the power controllers PWRS1 and PWRS2, or the auto frequency tuners AFTS1 and AFTS2, or a combination thereof. Moreover, the logic circuit 504 tunes the variable of the circuit components 518 via the driver 522 and the motor 520 based on the match tune signal 512.

Figure 5G:
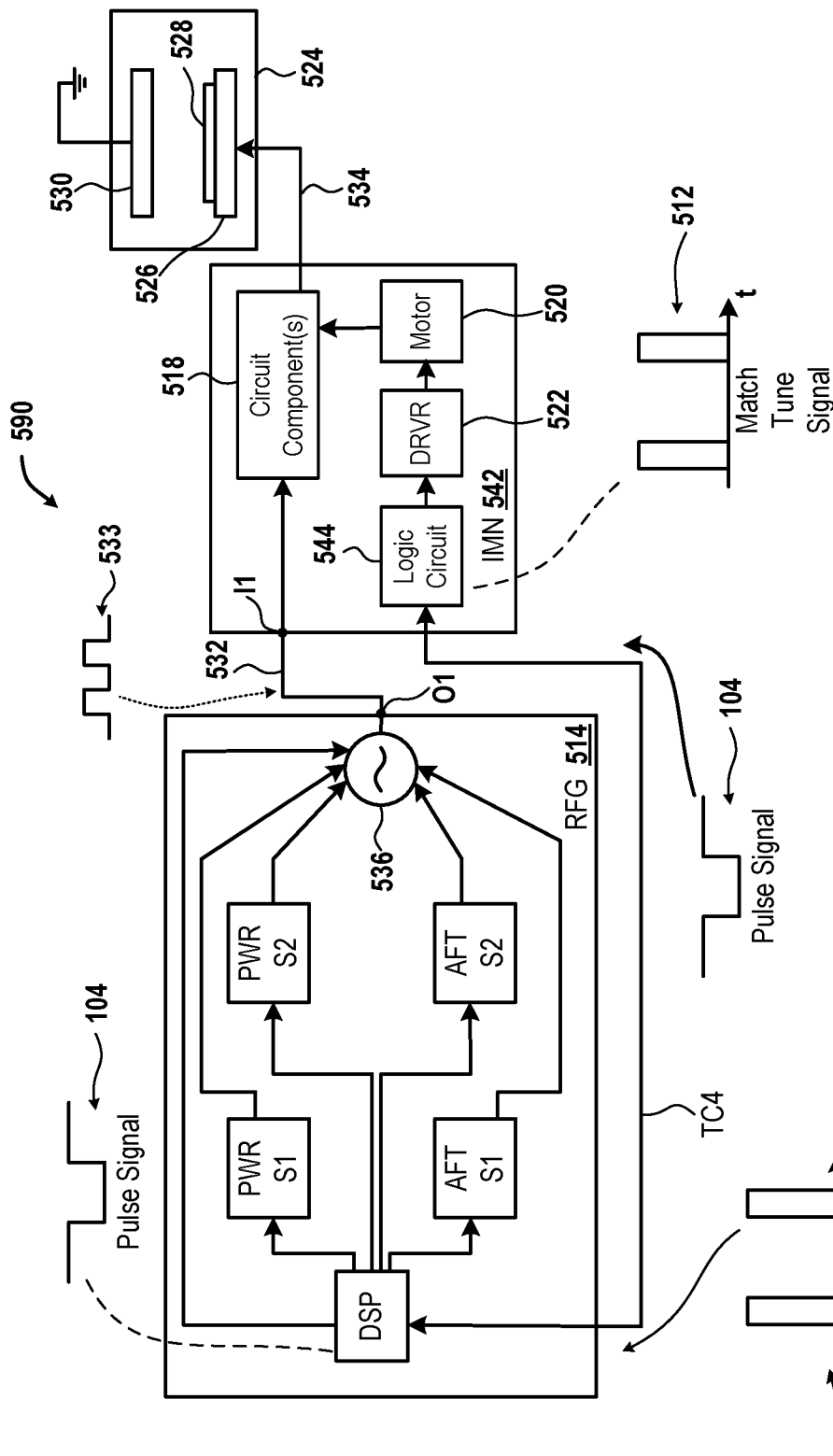
FIG. 5G is a diagram of an embodiment of a system to illustrate generation of the match tune signal and the RF parameter tune signal by the logic circuit of the impedance match based on the pulse signal received from the digital signal processor of the RF generator.

FIG. 5G is a diagram of an embodiment of a system 590 to illustrate generation of the match tune signal 512 and the RF parameter tune signal 508 by the logic circuit 544 of the impedance matching network 542 based on the pulse signal 104 received from the digital signal processor of the RF generator 514. The system 590 includes the RF generator 514, the impedance matching network 542, and the plasma chamber 524.

The digital signal processor of the RF generator 514 generates and sends the pulse signal 104 via the transfer cable TC4 to the logic circuit 544. Upon receiving the pulse signal 104, the logic circuit 104 generates the RF parameter tune signal 508 and the match tune signal 512 from the pulse signal 104. For example, timing relationships that are described above with reference to any of FIGS. 1A-3D are preserved while generating the RF parameter tune signal 508 and the match tune signal 512 from the pulse signal 104. The logic circuit 544 tunes the variable of the circuit components 518 according to the match tune signal 512 via the driver 522 and the motor 520.

The logic circuit 544 sends the RF parameter tune signal 508 via the transfer cable TC4 to the digital signal processor of the RF generator 514. Upon receiving the RF parameter tune signal 508 from the logic circuit 544, the digital signal processor of the RF generator 514 controls the power controllers PWRS1 and PWRS2, or the auto frequency tuners AFTS1 and AFTS2, or a combination thereof, to tune the RF signal 533 that is generated by the RF power supply 536.

Figure 5H:
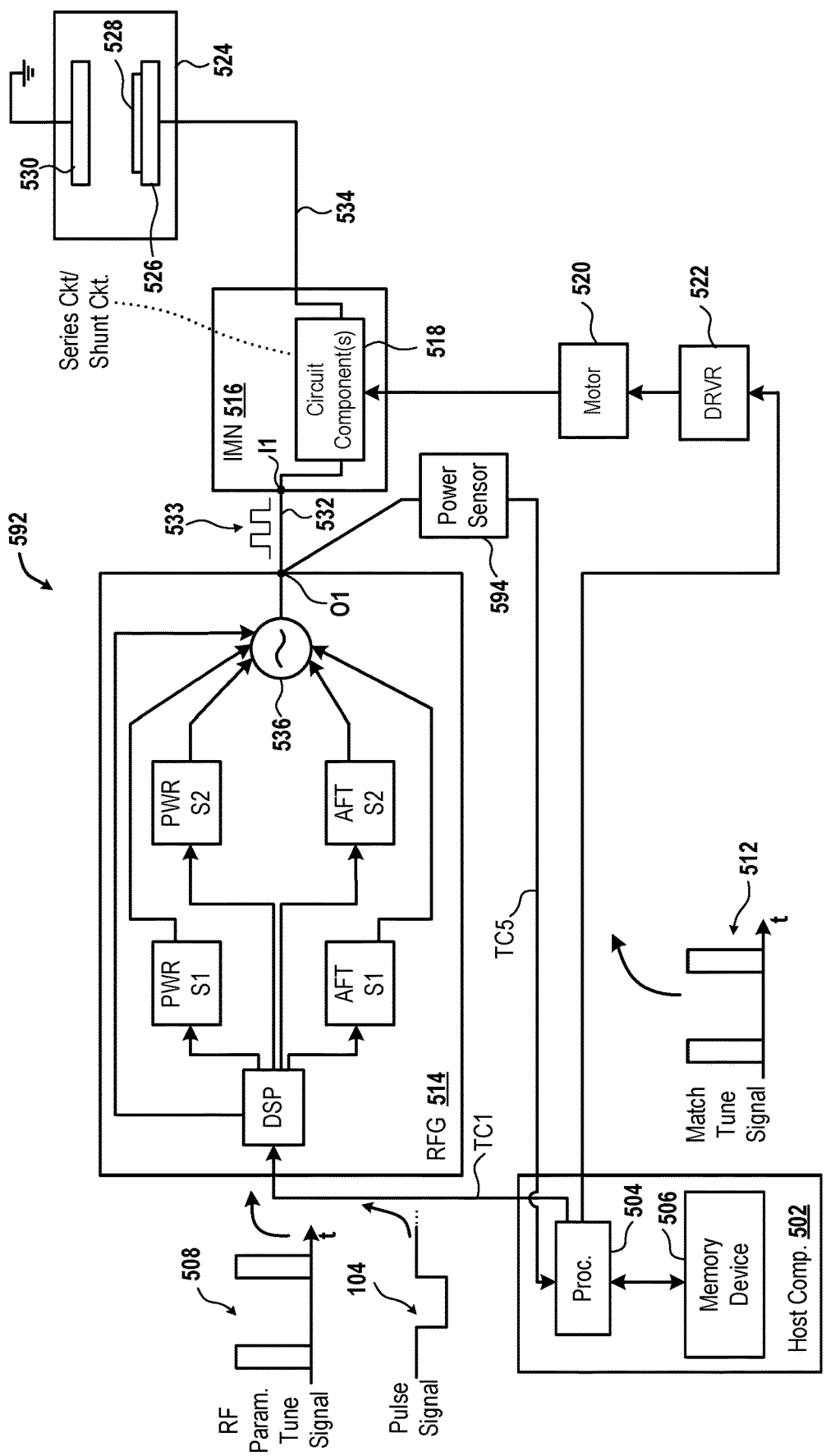
FIG. 5H is a diagram of an embodiment of a system to illustrate a determination of a time interval for which the RF generator is tuned to tune an RF signal based on the pulse signal.

FIG. 5H is a diagram of an embodiment of a system 592 to illustrate a determination of a time interval, such as the time interval t1 (FIGS. 1A, 3A-3D, & 4), or the time interval t2 (FIGS. 2A, 3A-3D, & 4) or the time interval t5 (FIGS. 1B & 2C), or the time interval t6 (FIGS. 1C & 2B), for which the RF generator 514 is tuned to tune the RF signal 533 based on the pulse signal 104. The system 592 is the same as the system 500 of FIG. 5A except that the system 592 includes a power sensor 594 that is coupled to the output O1 of the RF power supply 536. The output O1 of the RF power supply 536 is the same as the output O1 of the RF generator 514 and is coupled via the RF cable 532 to the input I1 of the impedance match. The input I1 of the impedance match is the same as the input I1 of the circuit components 518 of the impedance match. Examples of the power sensor 594 include a sensor that is used to measure a power characteristic, such as power that is reflected at the output O1 of the RF generator 514 or a power reflected coefficient at the output O1. The power reflection coefficient is a ratio of the power that is reflected at the output O1 to the power of the RF signal 533 supplied at the output O1 to the circuit components 518. The power reflected at the output O1 is power that is reflected from the plasma chamber 524 via the RF transmission line 534, the impedance match, and the RF cable 532 towards the RF generator 514.

The power sensor 594 is coupled via a transfer cable TC5 to the processor 504. During a beginning time interval of a first pulse of the pulse signal 104, upon receiving the power characteristic from the power sensor 594 via the transfer cable TC5, the processor 504 determines whether the power characteristic is less than a predetermined threshold and a rate of change, such as a decrease, of the power characteristic is greater than a preset limit. The first pulse occurs for the time interval ta. An example of the time interval at the beginning of the first pulse of the pulse signal 104 is a portion of the time interval ta (FIGS. 1A-3D and 4). Upon determining that the power characteristic is greater than the predetermined threshold and the rate of change of the power characteristic is less than the preset limit, the processor 504 controls the RF power supply 536 via the digital signal processor of the RF generator 514 and the power controllers PWRS1 and PWRS2, or via the digital signal processor and the auto frequency tuners AFTS1 and AFTS2, or via the digital signal processor and the power controllers PWRS1 and PWRS2 and the auto frequency tuners AFTS1 and AFTS2 to tune the RF signal 533 for the time interval t1, t5, or t6. The processor 504 continues to tune the RF generator 514 during the beginning time interval of the first pulse of the pulse signal 104 to tune the RF signal 533 until the power characteristic is less than the predetermined threshold and the rate of change of the power characteristic is greater than the preset limit.

In response to determining that the power characteristic is less than the predetermined threshold and the rate of change of the power characteristic is greater than the preset limit, the processor 504 stops tuning the RF generator 514 to stop tuning the RF signal 533 and begins tuning of the circuit components 518 to tune the variable of the circuit components 518 during the remaining time interval of the first pulse of the pulse signal 104. For example, the processor 504 tunes the variable of the circuit components 518 via the driver 522 and the motor 520 for the time interval t2 or t6 or t5. The processor 504 determines from the pulse signal 104 whether a second pulse that follows the first pulse has begun, receives the power characteristic during the beginning of the second pulse, and repeats the procedures that it performed during the first pulse. The second pulse occurs for the time interval tc. In this manner, the time interval for which the RF signal 532 is tuned and for which the variable of the circuit components 518 are tuned is different for each pulse of the pulse signal 104.

Figure 5I:
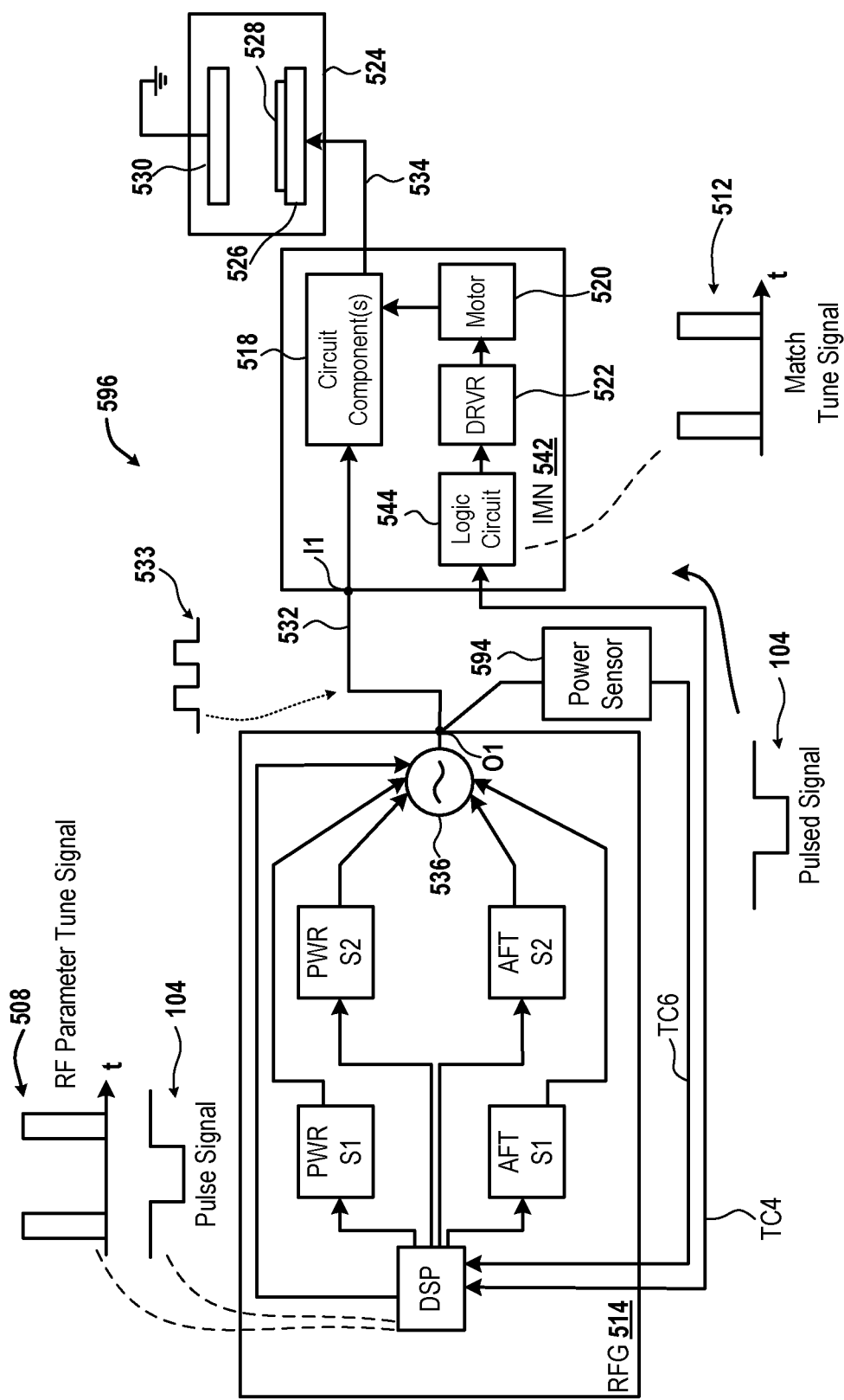
FIG. 5I is a diagram of an embodiment of a system to illustrate use of a power sensor with the system of FIG. 5F in which a host computer is not used.

FIG. 5I is a diagram of an embodiment of the system 596 to illustrate use of the power sensor 594 with the system 580 of FIG. 5F. The system 596 is the same as the system 580 except that in the system 596, the power sensor 594 is used. The power sensor 596 is coupled via a transfer cable TC6 to the digital signal processor of the RF generator 514. During a beginning time interval of the first pulse of the pulse signal 104, upon receiving the power characteristic from the power sensor 594 via the transfer cable TC6, the digital signal processor of the RF generator 514 determines whether the power characteristic is less than the predetermined threshold and the rate of change of the power characteristic is greater than the preset limit. Upon determining that the power characteristic is greater than the predetermined threshold and the rate of change of the power characteristic is less than the preset limit, the digital signal processor of the RF generator 514 controls the RF power supply 536 via the power controllers PWRS1 and PWRS2, or via the auto frequency tuners AFTS1 and AFTS2, or via the power controllers PWRS1 and PWRS2 and the auto frequency tuners AFTS1 and AFTS2 to tune the RF signal 533 for the time interval t1, t5, or t6. The digital signal processor of the RF generator 514 continues to tune the RF power supply 536 during the beginning time interval of the first pulse of the pulse signal 104 to tune the RF signal 533 until the power characteristic is less than the predetermined threshold and the rate of change of the power characteristic is greater than the preset limit.

Upon determining that the power characteristic is less than the predetermined threshold and the rate of change of the power characteristic is greater than the preset limit, the digital signal processor of the RF generator 514 stops tuning the RF power supply 536 to stop tuning the RF signal 533 and sends the pulse signal 104 and a command signal via the transfer cable TC4 to the logic circuit 544 to tune the variable of the circuit components 518 during the remaining time interval of the first pulse of the pulse signal 104. Upon receiving the command signal and the pulse signal 104, the logic circuit 544 initiates tuning of the circuit components 518 via the driver 522 and the motor 524 and continues the tuning for the remaining time interval of the first pulse of the pulse signal 104. For example, the logic circuit 544 tunes the variable of the circuit components 518 via the driver 522 and the motor 520 for the time interval t2 or t5 or t6 until the first pulse ends. The digital signal processor of the RF generator 514 determines from the pulse signal 104 whether the second pulse that follows the first pulse has begun, receives the power characteristic during the beginning of the second pulse, and repeats the procedure that it performed during the first pulse. In this manner, the time interval for which the RF signal 532 is tuned and for which the variable of the circuit components 518 are tuned is different for each pulse of the pulse signal 104.

In some embodiments, instead of applying both the power characteristic and the rate of change of the power characteristic, either the power characteristic or the rate of change is applied. For example, upon determining that the power characteristic is greater than the predetermined threshold or the rate of change of the power characteristic is less than the preset limit, the RF power supply 536 is controlled via the power controllers PWRS1 and PWRS2, or via the auto frequency tuners AFTS1 and AFTS2, or via the power controllers PWRS1 and PWRS2 and the auto frequency tuners AFTS1 and AFTS2 to tune the RF signal 533 for the time interval t1, t5, or t6. As another example, in response to determining that the power characteristic is less than the predetermined threshold or the rate of change of the power characteristic is greater than the preset limit, the RF generator 514 is no longer tuned to stop tuning the RF signal 533 after a time interval of the first pulse of the pulse signal 104 and tuning of the circuit components 518 is initiated to tune the variable of the circuit components 518 during the remaining time interval of the first pulse of the pulse signal 104.

In some embodiments, instead of transferring the pulse signal 1004 and the command signal, the digital signal processor of the RF generator 514 generates the match tune signal 512 and sends the match tune signal 512 via the transfer cable TC4 to the logic circuit 544. Upon receiving the match tune signal 512, the logic circuit 544 controls the circuit components 518 via the driver 522 and the motor 520 to tune the variable of the circuit components 518.

In some embodiments, any of the time intervals described herein, such as the time interval t1, or t2, or t5, or t6, or t7, or t8, or t9, or t10 are stored in a memory device of the digital signal processor of the RF generator 514 or in a memory device of the logic circuit 544 of the impedance matching network 542 or in the memory device 506 of the host computer 502.

It should be noted that in various embodiments, the lower electrode of the chuck 526 is coupled to the ground potential and the upper electrode 530 is coupled to the RF transmission line 534.

In several embodiments, the upper electrode 530 is coupled to an RF transmission line, such as the RF transmission line 534. Moreover, the RF transmission line is coupled to an impedance matching network, such as the impedance matching network 516 or 542. The impedance matching network is coupled to an RF generator, such as the RF generator 514, which is coupled to the host computer 502.

In some embodiments in which the host computer 502 is not used, the RF generator that supplies an RF signal to the upper electrode 530 via the impedance matching network is not coupled to the host computer 502.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A controller for applying frequency and match tuning for processing a substrate, comprising:
   logic configured to:
     control a radio frequency (RF) generator to generate an RF signal in synchronization with a pulse signal, wherein the pulse signal periodically alternates between a high state and a low state, wherein the high state has a greater logic level than the low state, wherein the RF signal has a high power level during the high state and a low power level during the low state, wherein the high power level is greater than the low power level;
     tune the RF signal during a first time interval associated with a portion of the pulse signal; and
     tune an impedance match during a second time interval associated with another portion of the pulse signal, wherein the second time interval lacks an overlap with the first time interval; and
   a memory device configured to store the first time interval and the second time interval.

2. The controller of claim 1, wherein the first time interval occurs during the high state and the second time interval occurs during the high state.

3. The controller of claim 1, wherein the first time interval occurs before or after the second time interval.

4. The controller of claim 1, wherein the first time interval is determined based on power that is reflected towards the RF generator, wherein the second time interval is determined from the first time interval.

5. The controller of claim 1, wherein the logic is configured not to tune the impedance match during the first time interval in which the RF generator is tuned and is configured not to tune the RF generator during the second time interval in which the impedance match is tuned.

6. The controller of claim 1,
   wherein the logic is configured to tune the RF signal during a portion of the high state of the pulse signal and during a portion of the low state of the pulse signal,
   wherein the logic is configured to tune the impedance match during a remaining portion of the high state of the pulse signal and during a remaining portion of the low state of the pulse signal.

7. The controller of claim 2, wherein the first time interval is half of a time interval for which the high state occurs and the second time interval is a remaining half of the time interval for which the high state occurs.

8. The controller of claim 2, wherein the first time interval is less than half of a time interval for which the high state occurs and the second time interval is greater than a remaining half of the time interval for which the high state occurs.

9. The controller of claim 2, wherein the first time interval is greater than half of a time interval for which the high state occurs and the second time interval is less than a remaining half of the time interval for which the high state occurs.

10. The controller of claim 1, wherein a low-to-high transition of an RF parameter tune signal from an off level to an on level occurs during the first time interval and a high-to-low transition of the RF parameter tune signal from the on level to the off level occurs during the first time interval, wherein a low-to-high transition from the off level to the on level of a match tune signal occurs during the second time interval and a high-to-low transition from the on level to the off level of the match tune signal occurs during the second time interval, wherein the high-to-low transition of the RF parameter tune signal during the first time interval occurs before the low-to-high transition of the match tune signal during the second time interval.

11. The controller of claim 1, wherein the logic is further configured to:
   tune the RF signal during a third time interval of the pulse signal; and
   tune the impedance match during a fourth time interval of the pulse signal, wherein the fourth time interval lacks an overlap with the third time interval,
   wherein a low-to-high transition of the RF parameter tune signal from an off level to an on level occurs during the third time interval and a high-to-low transition of the RF parameter tune signal from the on level to the off level occurs during the third time interval, wherein a low-to-high transition from the off level to the on level of the match tune signal occurs during the fourth time interval and a high-to-low transition from the on level to the off level of the match tune signal occurs during the fourth time interval, wherein the high-to-low transition of the RF parameter tune signal during the third time interval occurs before the low-to-high transition of the match tune signal during the fourth time interval.

12. The controller of claim 6, wherein the remaining portions of the high and low states occur after an occurrence of the portion of the high state, and the portion of the low state occurs after the remaining portions occur.

13. The controller of claim 6, wherein the remaining portion of the high state occurs before the portion of the high state, the portion of the low state occurs after the portion of the high state, and the remaining portion of the low state occurs after the portion of the low state.

14. The controller of claim 6, wherein the remaining portion of high state occurs after the portion of the high state, the portion of the low state occurs after the remaining portion of the high state, and the remaining portion of the low state occurs after the portion of the low state.

15. The controller of claim 6, wherein the portion of high state occurs after the remaining portion of the high state, the remaining portion of the low state occurs after the portion of the high state, and the portion of the low state occurs after the remaining portion of the low state.

* * * * *